(12) United States Patent
Uemura et al.

(10) Patent No.: US 10,665,436 B2
(45) Date of Patent: May 26, 2020

(54) PLASMA PROCESSING APPARATUS

(71) Applicant: Hitachi High-Technologies Corporation, Tokyo (JP)

(72) Inventors: Takashi Uemura, Tokyo (JP); Susumu Tauchi, Tokyo (JP); Kohei Satou, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 594 days.

(21) Appl. No.: 15/050,685

(22) Filed: Feb. 23, 2016

(65) Prior Publication Data

US 2016/0372305 A1  Dec. 22, 2016

(30) Foreign Application Priority Data

Jun. 17, 2015 (JP) .................................. 2015-121634

(51) Int. Cl.
*C23F 1/08* (2006.01)
*H01J 37/32* (2006.01)
*H01L 21/67* (2006.01)

(52) U.S. Cl.
CPC .... *H01J 37/3288* (2013.01); *H01J 37/32807* (2013.01); *H01J 37/32853* (2013.01); *H01L 21/6719* (2013.01); *H01L 21/67184* (2013.01)

(58) Field of Classification Search
CPC ....... C23F 1/08; H01L 34/311; H01L 21/3065
See application file for complete search history.

(56) References Cited

U.S. PATENT DOCUMENTS

| | | | |
|---|---|---|---|
| 2001/0001185 A1* | 5/2001 | Setoyama | B08B 7/00 156/345.42 |
| 2003/0003749 A1 | 1/2003 | Sexton et al. | |
| 2005/0193953 A1* | 9/2005 | Makino | H01J 37/32513 118/733 |
| 2006/0054278 A1* | 3/2006 | Makino | H01J 37/32522 156/345.27 |
| 2006/0099053 A1* | 5/2006 | Saito | C23C 16/44 414/217 |

(Continued)

FOREIGN PATENT DOCUMENTS

JP  2005-516379 A  6/2005
JP  2005-252201 A  9/2005

*Primary Examiner* — Robert M Kunemund
(74) *Attorney, Agent, or Firm* — Mattingly & Malur, PC

(57) ABSTRACT

A plasma processing apparatus has a vacuum container having a processing chamber in which a wafer is processed by plasma and at least one member constituting the vacuum container movable and detachable in a horizontal direction with respect to a base plate. The plasma processing apparatus includes a lifter arranged at a side of the vacuum container across the vacuum container on the base plate, coupled to an end portion on the opposite side of a vacuum transfer chamber on which the wafer is transferred in a decompressed interior, and having a vertical shaft to move the detachable member vertically. The lifter includes: a coupling portion coupled to the vertical shaft and the detachable member and moved along the vertical shaft; and a turning shaft being a joint portion arranged at the coupling portion and having a vertical rotational shaft, the detachable member being horizontally turned around the turning shaft.

6 Claims, 14 Drawing Sheets

(56) References Cited

U.S. PATENT DOCUMENTS

2010/0166955 A1\* 7/2010 Becker ................ C23C 16/4401
 427/248.1
2015/0214014 A1\* 7/2015 Sato .................. H01J 37/32899
 156/345.27
2016/0217976 A1\* 7/2016 Uemura .............. C23C 16/4412

\* cited by examiner

PLASMA PROCESSING APPARATUS

BACKGROUND OF THE INVENTION

1. Field of the Invention

The present invention relates to a plasma processing apparatus that processes a substrate-like specimen such as a semiconductor wafer transferred and arranged in a decompressed processing chamber within a vacuum container by the use of plasma formed in the processing chamber, and includes a plurality of members detachably arranged at vertical positions and constituting the vacuum container.

2. Description of the Related Art

A generally-known semiconductor wafer manufacturing apparatus for manufacturing a semiconductor device from a substrate-like specimen such as a semiconductor wafer applies processing with plasma such as etching to a film layer to be processed of a film structure having a plurality of film layers including a mask pre-formed on the upper surface of the specimen arranged in a decompressed processing chamber within a vacuum container. In such a plasma processing apparatus, for example, a processing gas is introduced into the decompressed processing chamber inside the vacuum container, an electric field or a magnetic field is supplied to the processing chamber to excite the processing gas and produce plasma, and the film layer to be processed on the semiconductor wafer suctioned and held on a specimen stage by electrostatic force is processed by chemical reactions between active particles such as radicals included in the plasma and the material of the film layer to be processed, and interactions including physical reactions such as sputtering of charged particles such as ions.

The particles of reaction products formed in the processing chamber during the processing of a specimen such as a wafer float in the processing chamber and stick to the inner wall surfaces. As the total number of processed specimens and the total amount of processing time increase, the deposited particles accumulate and form a film on the inner surface of the processing chamber. As a result, the deposited matter interacts with plasma formed in the processing chamber, and its flakes and particles float again in the processing chamber and stick to the surface of the specimen to contaminate the specimen and the film structure for a semiconductor device circuit formed on the surface of the specimen. This causes a problem of deterioration in performance of the semiconductor device to be produced by the processing, thereby leading to occurrence of failure and yield reduction. In addition, the amount of interaction between the matter deposited to the inner surface of the processing chamber and the plasma influences the values of potential, density, and strength of the plasma above the upper surface of the specimen and the distribution of the plasma. With the increases in the total number of processed specimens and the total amount of processing time, the increase of the deposited matter affects the results of processing on specimens. Accordingly, the results of processing on a plurality of specimens fluctuate even from the beginning. This causes a problem that the processed shapes increasingly deviate from a desired one over time.

To solve these problems, conventionally, when it is determined that the total number of processed specimens and the total amount of processing time have reached predetermined values, the operation of the plasma processing apparatus is temporarily stopped, and the processing chamber is cleaned to eliminate deposited matter from the inner surface of the processing chamber and recover the inner surface of the processing chamber to an extent that desired processing results can be obtained. For the cleaning, the processing chamber inside the vacuum container is subjected to atmospheric (air) pressure and opened to the air, and the surfaces of members in the processing chamber are wiped (wet-cleaned) with cloth or the like using a drug solution.

To perform such cleaning, it is necessary to open the interior of the processing chamber under air pressure and halt the processing of a specimen at each cleaning time. Accordingly, it is important to shorten the time taken for the cleaning as much as possible to enhance the operating rate of the vacuum processing apparatus and improve the entire processing efficiency. In addition, the particles of reaction products and the like stick to not only the surfaces of the members in the processing chamber but also the surface of the specimen stage arranged in the processing chamber to hold a semiconductor wafer on the upper surface. Accordingly, it is also necessary to perform wet-cleaning or the like to eliminate the deposited matter from the surfaces of the specimen stage other than the upper surface on which the specimen is to be placed.

The time taken for wet-cleaning of the surfaces of the members constituting the processing chamber can be shorten by detaching the vacuum container or its parts exposed to the vacuum processing atmosphere and carrying reaction products and then replacing it with a new or cleaned one. One of such conventional techniques is known as disclosed in JP-2005-252201-A, for example. As the conventional technique, there is disclosed a vacuum processing apparatus that includes an upper inner cylindrical chamber and a specimen stage constituting a processing chamber for processing a subject to be processed within an external chamber, and a lower internal cylindrical chamber arranged at an exhaust part side.

According to this conventional technique, for maintenance of the apparatus, a discharge chamber base plate arranged on the top of the upper inner cylindrical chamber and constituting a discharge chamber for generating plasma is rotated and lifted upward around a hinge portion arranged at a transfer chamber side as a supporting point to produce a working space for the upper inner chamber, and the upper inner chamber is lifted off the outer chamber. In addition, according to this conventional technique, a specimen stage base plate to which a ring-shaped support base member (specimen stage block) including support beams arranged and fixed around the vertical center of the specimen stage as an axis is fixed, is rotated and lifted around the hinge portion arranged at the transfer chamber side as a supporting point to produce a working space for the lower inner chamber, and the lower inner chamber is lifted off the outer chamber, and the members of the chamber are replaced by other ones with surfaces regarded as being unused or cleaned.

By arranging the support beams axisymmetrically with respect to the vertical center of the specimen stage as an axis (that is, the shape of a gas flow path relative to the central axis of the specimen stage is in approximately concentric axis symmetry), a gas and other components (processing gas, and particles and reaction products in the plasma) in the space above the specimen stage within the upper inner cylindrical chamber are passed through the space between the support beams and are discharged via the lower inner cylindrical chamber. Accordingly, the gas flows uniformly in the circumferential direction of the subject to be processed, which allows uniform processing of the subject to be processed.

Meanwhile, JP-2005-516379-A discloses a cantilever substrate support part with an electrostatic chuck assembly that is attachable to or detachable from a vacuum processing chamber by forming (horizontally) openings in side walls of the chamber. Since the substrate support part including the specimen stage can be removed from the vacuum container, the interior of the processing chamber does not need to be opened to clean the surfaces of the specimen stage. In addition, the inner side walls of the processing chamber and the surfaces of the substrate support part including the specimen stage can be cleaned simultaneously to shorten the time taken for working, reduce the non-operating time of the apparatus, and improve the entire processing efficiency.

SUMMARY OF THE INVENTION

The foregoing conventional techniques have problems due to insufficient considerations in the following respects.

Specifically, according to the foregoing conventional technique, the vacuum container has other multiple containers therein, and the processing chamber for forming plasma is provided in the innermost container. The inner surface of the innermost container faces the plasma and gathers particles of reaction products and other components resulting from wafer processing which are attached on the inner surface. Therefore, the innermost container is replaced by a new or clean one to shorten the time for cleaning the inner surface of the processing chamber such that it is possible to suppress adverse effects on the processing performance. However, the nested structure of the inner and outer containers puts a heavy burden on a worker at the time of removal of the inner container.

To separate the inside and outside of the inner container in an airtight manner, it is necessary to apply a vertical load to deform a seal member such as an O ring in contact with the inner container. To achieve this, the inner container needs to be enclosed in the vacuum container such that the load is transferred from the outside to the inner container when the apparatus is operable. Accordingly, to take out the inner container, the worker needs to carry and move vertically the heavy inner container from the inside of the vacuum container at a distance from the upper ends of the side walls of the vacuum container. This causes a long maintenance time and places a heavy burden on the worker. In addition, the downtime of the apparatus becomes longer, thereby deteriorating the processing efficiency of the apparatus.

Further, as the diameter of the wafer to be processed is larger, the diameter of the vacuum container outside the inner container storing the wafer inevitably becomes larger. This brings about further increase in the footprint of the apparatus processing the wafer on the floor of a building.

According to the technique disclosed in JP-2005-516379-A, there is no need to move upward the inner container and detach the same from the outer vacuum container. However, the substrate support part is vacuum-sealed at the openings in the chamber side walls. Accordingly, when the substrate support part becomes larger in weight due to increase of the apparatus dimensions to support a large-diameter wafer, a heavier load may be placed on the vacuum-seal portion making it difficult to maintain vacuum. In addition, according to this conventional technique, the shape of the gas flow path is not concentrically axisymmetric with respect to the central axis of the specimen support part because the specimen support part is a cantilever. This may result in a problem that the gas does not flow uniformly in the circumferential direction of the subject to be processed and it is difficult to process uniformly the subject to be processed.

In the foregoing conventional techniques, no sufficient considerations are given in these respects. An object of the present invention is to provide a vacuum processing apparatus that enhances the processing efficiency with improvement in the efficiency of maintenance work.

The above object is achieved by providing a plasma processing apparatus having: a vacuum container having a processing chamber in which a wafer arranged in a decompressed interior is processed by use of plasma; and a base plate on which the vacuum container is placed, the base plate having an opening through which a gas is exhausted from the processing chamber inside the vacuum container, at least one member constituting the vacuum container being configured to be movable and detachable in a horizontal direction relative to the base plate, wherein the plasma processing apparatus includes a lifter that is arranged at a side of the vacuum container on the base plate across the vacuum container and coupled and attached to an end portion of a vacuum transfer chamber on the side opposite to the side on which the wafer is transferred in a decompressed interior, and has a vertical shaft to move vertically the detachable member, and the lifter includes: a coupling portion that is coupled to the vertical shaft and the detachable member and is moved along the vertical shaft; and a turning shaft that is a joint portion arranged at the joint portion and having a vertical rotational shaft, the detachable member being horizontally turned around the turning shaft.

According to the present invention, it is possible to provide a vacuum processing device that enhances the processing efficiency with improvement in the efficiency of maintenance work.

DESCRIPTION OF THE EMBODIMENTS

Figure 1A:
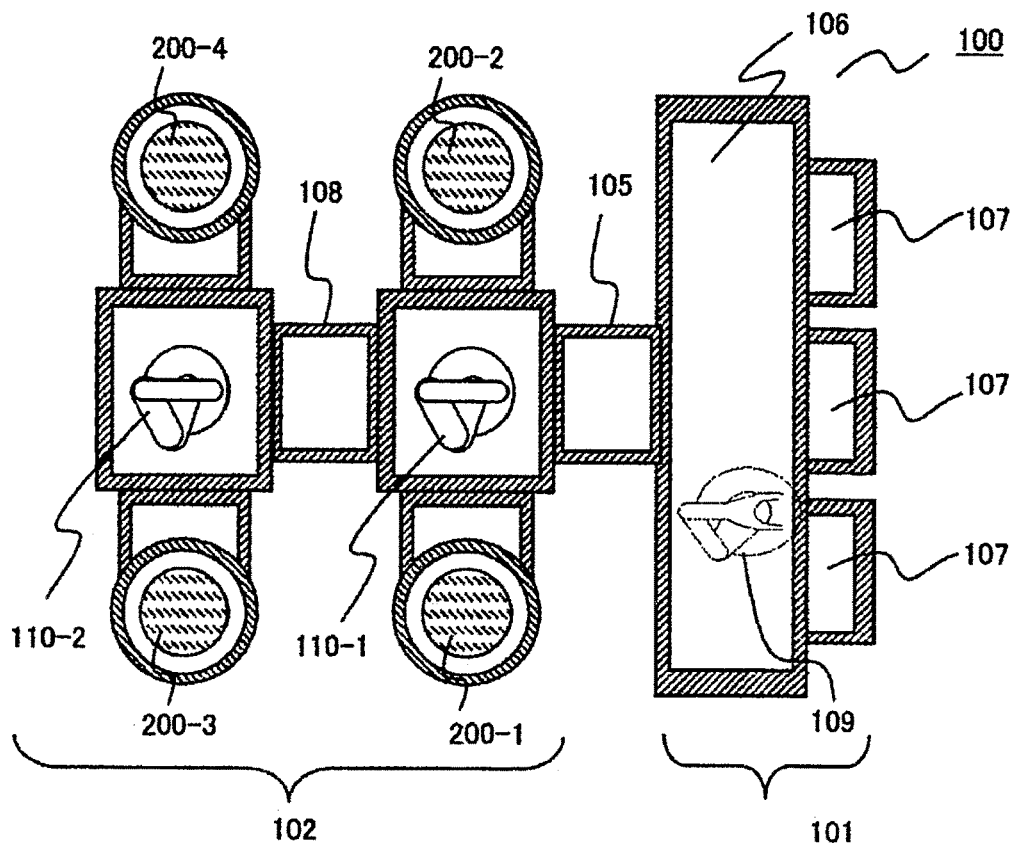
FIGS. 1A and 1B are schematic top views (partially perspective) of a vacuum processing apparatus according to an example of the present invention.

An embodiment of the present invention will be described with reference to the drawings.

An example of the present invention will be described with reference to FIGS. 1 to 14. Identical reference signs in the drawings indicate identical components.

Figure 1B:
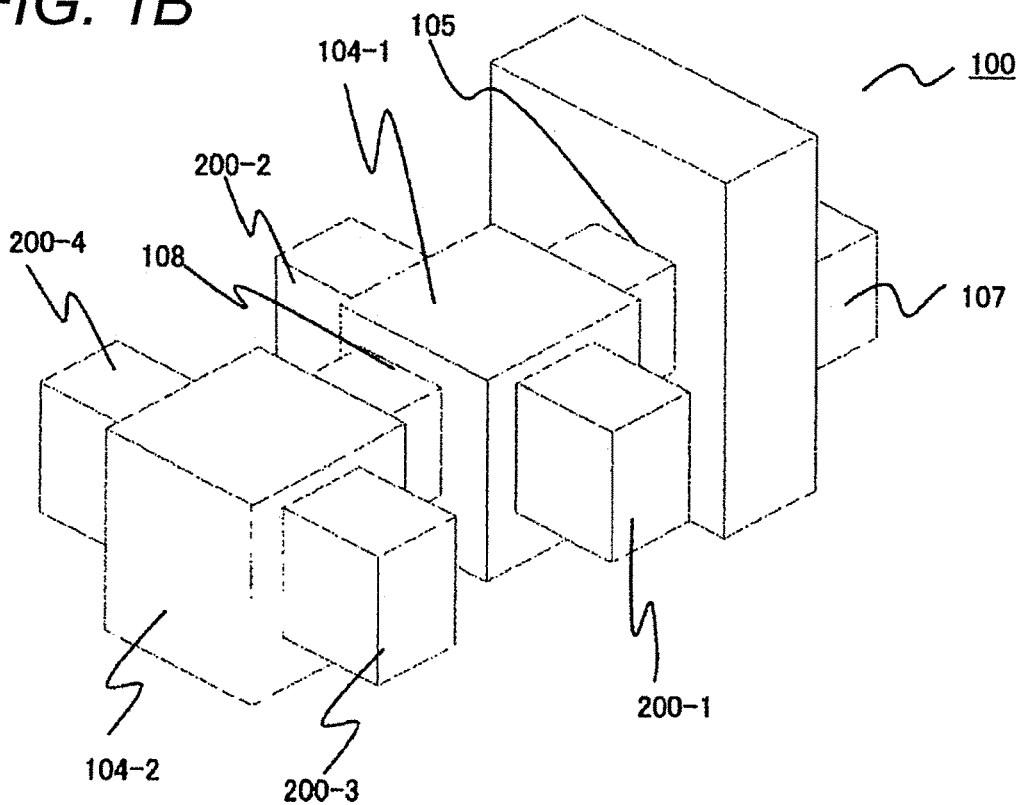

FIGS. 1A and 1B are diagrams illustrating schematically a configuration of a vacuum processing apparatus according to an example of the present invention. FIG. 1A is a transverse cross-sectional view of a vacuum processing apparatus 100 seen from above according to the example, and FIG. 1B is a perspective view of the vacuum processing apparatus 100 according to the example.

The vacuum processing apparatus 100 in the example includes an air block 101 arranged at the front side (the right side in FIGS. 1A and 1B) and a vacuum block 102 arranged at the rear side (the left side in FIGS. 1A and 1B). A substrate-like specimen such as a semiconductor wafer is transferred into the air block 101 and positioned there under air pressure. The specimen is transferred into the vacuum block 102 under a pressure lower than the air pressure or is processed there. The vacuum block 102 includes a portion where the specimen is placed under an increased or decreased pressure.

The air block 101 includes: a housing having an air transfer chamber 106 as a space with a rectangular parallelepipedic outer shape or an approximate outer shape regarded as being close to that under air pressure or an approximate pressure regarded as being close to that; and a plurality of cassette stages 107 that is aligned along the front side surface of the housing, cassettes storing therein specimens to be processed or cleaned being placed on the cassette stages 107. In the air block 101, wafers as specimens to be processed or cleaned stored in the cassettes on the cassette stages 107 are exchanged between the cassettes and the vacuum block 102 coupled to the rear surface of the air transfer chamber 106. The air transfer chamber 106 contains an air transfer robot 109 including a wafer holding arm for transfer of the wafers.

The vacuum block 102 includes: a plurality of vacuum processing units 200-1, 200-2, 200-3, and 200-4 including vacuum containers having processing chambers where specimens are to be processed under a reduced pressure; vacuum containers that are coupled to the vacuum processing units and have vacuum transfer chambers 104-1 and 104-2 as transfer spaces containing vacuum transfer robots 110-1 and 110-2 transferring the specimens under a reduced pressure; a vacuum container that is connected between the vacuum containers for vacuum transfer (vacuum transfer containers) and the housing of the air transfer chamber 106 to store the arranged wafer and has a lock chamber 105 communicable with the vacuum transfer chamber 104-1 and the air transfer chamber 106; and a vacuum container that has a transfer intermediate chamber 108 as a wafer storage space connected between the two vacuum transfer containers and communicable with the vacuum transfer chambers 104-1 and 104-2. The vacuum block 102 includes vacuum containers in which the internal pressure is reduced and maintained at a predetermined value of vacuum degree.

The transfer operations by the air transfer robot 109 and the vacuum transfer robot 110, the processing of wafers by the vacuum processing units, the sealing, opening, and pressure reduction and rising of the lock chamber 105 by the vacuum processing apparatus 100 are controlled by a control device not illustrated that is connected to the relevant components via wired or wireless communication paths in such a manner as to be capable of signal transmission and reception. The control device includes an interface that transmits and receives signals to and from the external communication paths, a computing unit such as a microprocessor of a semiconductor device, storage devices such as a RAM, a ROM, a hard disc, and a removable disc storing software applications describing arithmetic algorithms by the computing unit and data indicative of signal values and the like, and communication lines connecting these units in a communicable manner.

Figure 2:
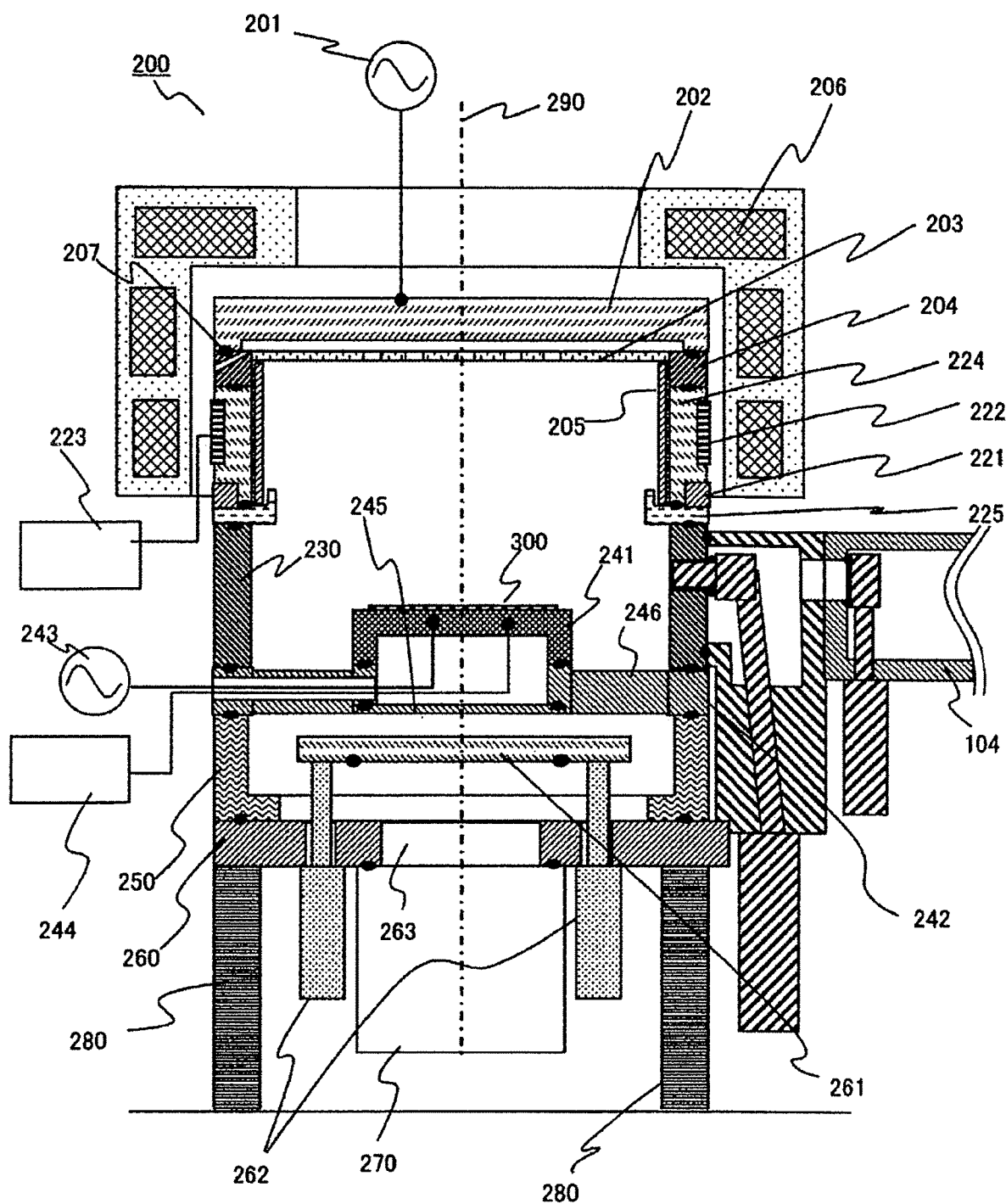
FIG. 2 is a cross-sectional view of a vacuum processing unit in the vacuum processing apparatus according to the example of the present invention.

A configuration of a plasma processing apparatus according to the example will be described with reference to FIG. 2. FIG. 2 is a vertical cross-sectional view of a vacuum processing unit in the example illustrated in FIGS. 1A and 1B. The vacuum processing units 200-1, 200-2, 200-3, and 200-4 in the example are identical or regarded as approximately identical in structure and operation. They are configured such that, even one of them replaces the remaining three, the identical or equivalent results of wafer processing can be obtained. Referring to FIG. 2, either the vacuum processing units 200-1 or 200-2 coupled to the vacuum transfer chamber 104-1 will be described as a vacuum processing unit 200 as an example.

The vacuum processing unit 200 illustrated in FIG. 2 includes: a vacuum container including an upper container 230 and a lower container 250 having processing chambers as spaces where a wafer 300 is arranged and plasma is formed; an exhaust pump 270 that includes a vacuum pump such as a turbo-molecular pump coupled to the vacuum container and arranged under the vacuum container; a first high-frequency power source 201 that is arranged above the vacuum container to form an electric field for plasma formation; and a solenoid coil 206 that forms a magnetic field. The outer peripheries of the upper container 230 and the lower container 250 are exposed to the atmosphere (air) around the vacuum processing unit 200. These containers constitute vacuum walls that separate the inner processing chambers and the outer atmosphere in an airtight manner.

The upper container 230 and the lower container 250 have circular inner walls in cross section in the horizontal direction. A cylindrical specimen stage 241 is arranged at the center of the circular interior. The specimen stage 241 is held by a specimen stage base 242 as a ring-shaped member surrounding the outer periphery of the specimen stage 241 and support beams 246 as beam-shaped members extending in the horizontal direction (the horizontal direction in FIG. 2).

The support beams 246 are arranged axisymmetrically around a vertical axis (central axis 290) passing through the center of the cylindrical shape of the specimen stage 241, that is, are radially arranged at an equal angle or an angle regarded as being approximately equal around the central axis 290. The support beams 246 suppress unevenness in the flow rate and speed of a gas in the processing chamber flowing downward through the circumference of the side walls of the specimen stage 241 around the central axis 290. The gas or particles of plasma and reaction products introduced into the processing chamber above the specimen stage 241 within the upper container 230 pass through the space between the support beams 246, that is, the space surrounded by the specimen stage 241, the support beams 246, and the specimen stage base 242, and flow into the space of the processing chamber surrounded by the lower container 250 under the specimen stage 241. Accordingly, it is possible to suppress unevenness of the gas flow in the circumferential direction of the wafer 300 placed on a circular placement surface of a dielectric film constituting the top of the specimen stage 241, and reduce deviations of the processed result of the wafer 300 in the circumferential direction from a desired processed result and unevenness in the processed result of the wafer 300. The specimen stage base 242 is ring-shaped with the support beams. The ring part is held and vacuum-sealed around the lower container and the upper container as the vacuum container, which accommodates to weight increase of the specimen stage and the like.

The vacuum container of the vacuum processing unit 200 in the example is composed of a plurality of components including: the cylindrical lower container 250 that is vertically placed on a base plate 260 placed and connected to the upper ends of a plurality of columns 280 arranged on a floor surface of a building such as a clean chamber where the vacuum processing apparatus 100 is installed; the ring-shaped specimen stage base 242 including the support beams 246; the cylindrical upper container 230; an earth ring 225, a cylindrical discharge block 224; and a gas introduction ring 204. O rings 207 as vacuum-seal members are sandwiched between the members and a load is applied to the O rings 207 to seal the insides and outsides of the containers in an airtight manner.

A cylindrical quartz inner cylinder 205 is arranged to cover the inside of the cylindrical inner wall of the discharge block 224. A heater 222 is wound around the cylindrical outer side wall of the discharge block 224. The discharge block 224 is connected to a ring-shaped discharge block base 221 arranged below to constitute a discharge block unit 220 described later together with the heater 222.

A specimen stage bottom cover 245 is arranged on the lower surface of the cylindrical specimen stage 241 and attached to the specimen stage 241 to constitute part of the specimen stage 241 and seal in an airtight manner between the internal space under air pressure and the processing chamber. The internal space communicates with the atmosphere (air) on the outside of the vacuum processing unit 200 via paths arranged in the support beams 246. The specimen stage 241, the specimen stage base 242 arranged in a ring shape on the outer periphery of the specimen stage 241, and the plurality of support beams 246 constitute a specimen stage unit 240 described later.

The upper container 230, the lower container 250, and the base plate 260 have flange portions. The upper container 230 and the lower container 250 are screwed by bolts or the like to the base plate 260 via the flange portions, and are fixed in position on the base plate 260. In the example, the members constituting the vacuum container of the vacuum processing unit 200 are cylindrical in shape. However, these members may have outer walls rectangular in cross section, not circular, in the horizontal direction.

Arranged on the vacuum container of the vacuum processing unit 200 are a disc-shaped cover member 202 constituting the vacuum container and a disc-shaped shower plate 203 opposed to the placement surface of the wafer 300 on the top of the specimen stage 241 under the cover member 202 and constituting a ceiling surface of the processing chamber. The cover member 202 and the shower plate 203 are dielectric members of quartz or the like configured to let through high-frequency electric fields of micro waves, UHF and VHF waves.

In this configuration, an electric field is formed through oscillation by the first high-frequency power source 201 arranged above the cover member 202, propagated to the cover member 202, passed through the cover member 202 and the shower plate 203 arranged under the cover member 202, and supplied to the processing chamber downward from the top of the specimen stage 241. In addition, the solenoid coil 206 as a means for forming a magnetic field is arranged above the vacuum container, in particular in the example, on the outer periphery of the outer wall of the discharge block 224 and above the cover member to surround the discharge block 224 and the cover member. The magnetic field generated by the solenoid coil 206 is supplied to the processing chamber.

The shower plate 203 has a plurality of processing gas introduction holes as through holes, and the processing gas introduced through the gas introduction ring 204 is supplied through the introduction holes to the vacuum processing unit. The plurality of introduction holes in the shower plate 203 is arranged in axisymmetrical areas around the central axis 290 of the specimen stage 241 above the specimen placement surface on the top of the specimen stage 241. The processing gas formed of different gas components by a predetermined composition is introduced into the vacuum processing unit through the evenly-spaced introduction holes.

The processing gas is introduced from a gas source such as a gas tank not illustrated into the gap space between the cover member 202 and the shower plate 203 through a pipeline and an inner path in the gas introduction ring 204 connected to the pipeline, diffuses and fills the space, and then flows into the processing chamber through the plurality of gas introduction holes as through holes arranged in the center of the shower plate 203. The atoms and molecules of the processing gas introduced into the processing chamber are excited by the interaction between the first high-frequency power source 201 and the electric field and the magnetic field supplied from the solenoid coil 206, and are turned into plasma in the space of the processing chamber within the discharge block 224 above the specimen stage 241.

At this time, the atoms and molecules of the processing gas in the plasma become dissociated and turned into charged particles such as ions or activated species such as radicals with a higher energy level. In the example, the heater 222 is connected to a first temperature controller 223 and wound around the outer side wall of the discharge block 224. The surface of the quartz inner cylinder 205 in contact with the plasma is heated by DC power supplied to the heater 222 and is adjusted to a temperature value within a range suited to processing.

This reduces attachment of reaction products to the quartz inner cylinder 205 and the discharge block 224. In the example, these members can be excluded from the target of regular maintenance.

The specimen stage 241 for placement of the wafer 300 is arranged inside the vacuum processing unit in alignment with the central axis 290 of the shower plate 203. To process the wafer 300 by plasma, the wafer 300 is placed on the circular placement surface on the top of the specimen stage 241 and is suctioned and held (electrostatic chuck) by film static electricity of the dielectric constituting the surface.

A disc-shaped or cylindrical metallic base material arranged in the specimen stage 241 is connected to a second high-frequency power source 243 that supplies high-frequency power to form a bias potential above the wafer 300 placed on the placement surface of the specimen stage 241. By the use of high-frequency power at a predetermined frequency lower than the frequency of first high-frequency power supplied to the base material as an electrode, a film layer to be processed in the film structure with a plurality of film layers including a mask pre-formed on the surface of the wafer 300 is etched through a physical reaction caused by inducing and smashing charged particles in the plasma against the surface of the film layer to be processed depending on the difference in a high-frequency bias potential and a plasma potential formed above the specimen stage 241 and the wafer 300 on the specimen stage 241, and a chemical reaction between the radical and the wafer surface.

A concentric or spiral refrigerant flow path is formed around the central axis 290 of the specimen stage 241 in the vertical direction within the base material of the specimen stage 241. A heat-exchange medium is set at a temperature within a desired range by a second temperature controller 244 and is supplied and flown through the refrigerant path. According to this configuration, when the wafer 300 exchanges heat with the heat-exchange medium, the temperatures of the specimen stage 241 and the wafer 300 are adjusted within the range suited for processing.

A power cord for supplying high-frequency bias power to the specimen stage 241 and a pipe for supplying the heat-exchange medium (refrigerant) for temperature adjustment of the specimen stage 241 or a wire cord for temperature control are arranged in a pipeline formed within the specimen stage base 242 including the support beams 246 and communicating with the atmosphere on the outside of the vacuum processing unit 200. Although not illustrated, wire cords for temperature sensors and electrostatic chuck can be arranged in the pipeline as well as the foregoing wire cords. The upper container 230 is a target of regular maintenance because the upper container 230 arranged around the specimen stage 241 is likely to become encrusted with reaction products.

The exhaust pump 270 is arranged under the vacuum container of the vacuum processing unit 200 and is coupled to the bottom of the vacuum container and the base plate 260 having an exhaust opening 263 for discharging the gas and the plasma particles from the processing chamber. The circular exhaust opening 263 in the base plate 260 is arranged just below the specimen stage 241 at a position concentric with the central axis 290 or an approximate position regarded as being equivalent.

An approximately disc-shaped exhaust portion cover 261 is arranged above the exhaust opening 263 and is vertically moved by driving vertically an actuator 262 coupled to an arm portion extending in the horizontal direction (the horizontal direction in the drawing) on the outer periphery of the exhaust portion cover 261, thereby to increase or decrease the distance between the exhaust opening 263 and the exhaust portion cover 261 to adjust conductance of exhaust from the processing chamber. During the processing of the wafer 300, the flow rate or speed of the gas and the plasma in the vacuum processing unit to be discharged to the outside are adjusted by the value of the conductance and the volume of exhaust from the exhaust pump 270 per unit time, and the pressure in the processing chamber is adjusted to a desired vacuum degree by the balance between the exhaust and the supply of the processing gas.

The processing gas and plasma introduced into the processing chamber and the reaction products generated during the processing are passed from the upper part of the vacuum processing chamber to the space between the outer peripheral wall of the specimen stage 241 and the inner peripheral wall surface of the specimen stage base 242, and are discharged through the exhaust opening 263 at the lower side via the lower container 250, by the action of the exhaust means such as the exhaust pump 270. Accordingly, the lower container 250 is exposed to the flow of gas exhausted from the top of the specimen stage 241 and the reaction products are likely to stick on the surface of the lower container 250. Accordingly, at regular maintenance, by rotating and moving the specimen stage base 242 in the horizontal direction and removing the lower container 250 from above as described later, the inner surface of the lower container 250 can be cleaned or the lower container 250 can be replaced by a clean one.

In the foregoing example, the pressure in the processing chamber where the wafer 300 is being etched is detected by the control unit not illustrated that is communicably connected to a vacuum gauge not illustrated and uses an output from the vacuum gauge. Then, based on the detected value of pressure, the flow rate and speed of exhaust air are regulated by the vertical movement of the exhaust portion cover 261 resulting from the operation of the actuator 262 having received a command signal calculated and transmitted by the control unit, thereby adjusting the pressure in the processing chamber. In this example, the pressure during the processing is adjusted to a predetermined value within a range of 0.1 to 4 Pa.

The exhaust portion cover 261 closes the exhaust opening 263 in an airtight manner with the O ring between the two during the maintenance work in which the interior of the vacuum processing unit 200 is opened to the atmosphere, thereby to seal the inlet of the exhaust pump 270 against the outside air. The lower container 250 is a target member of regular maintenance because reaction products formed in the processing chamber above the lower container 250 are likely to stick to the inner wall surface of the lower container 250.

The processing gas for use in plasma processing may be a single gas or a mixture of gases of multiple kinds blended at an optimum flow ratio under each condition for steps of processing the film layer to be processed of the wafer 300. The mixed gas is adjusted in flow rate by a gas flow controller (not illustrated) and is introduced via the gas introduction ring 204 coupled to the gas flow controller into a gas retention space between the shower plate 203 and the cover member 202. In the example, the stainless-steel gas introduction ring 204 is used.

Figure 3:
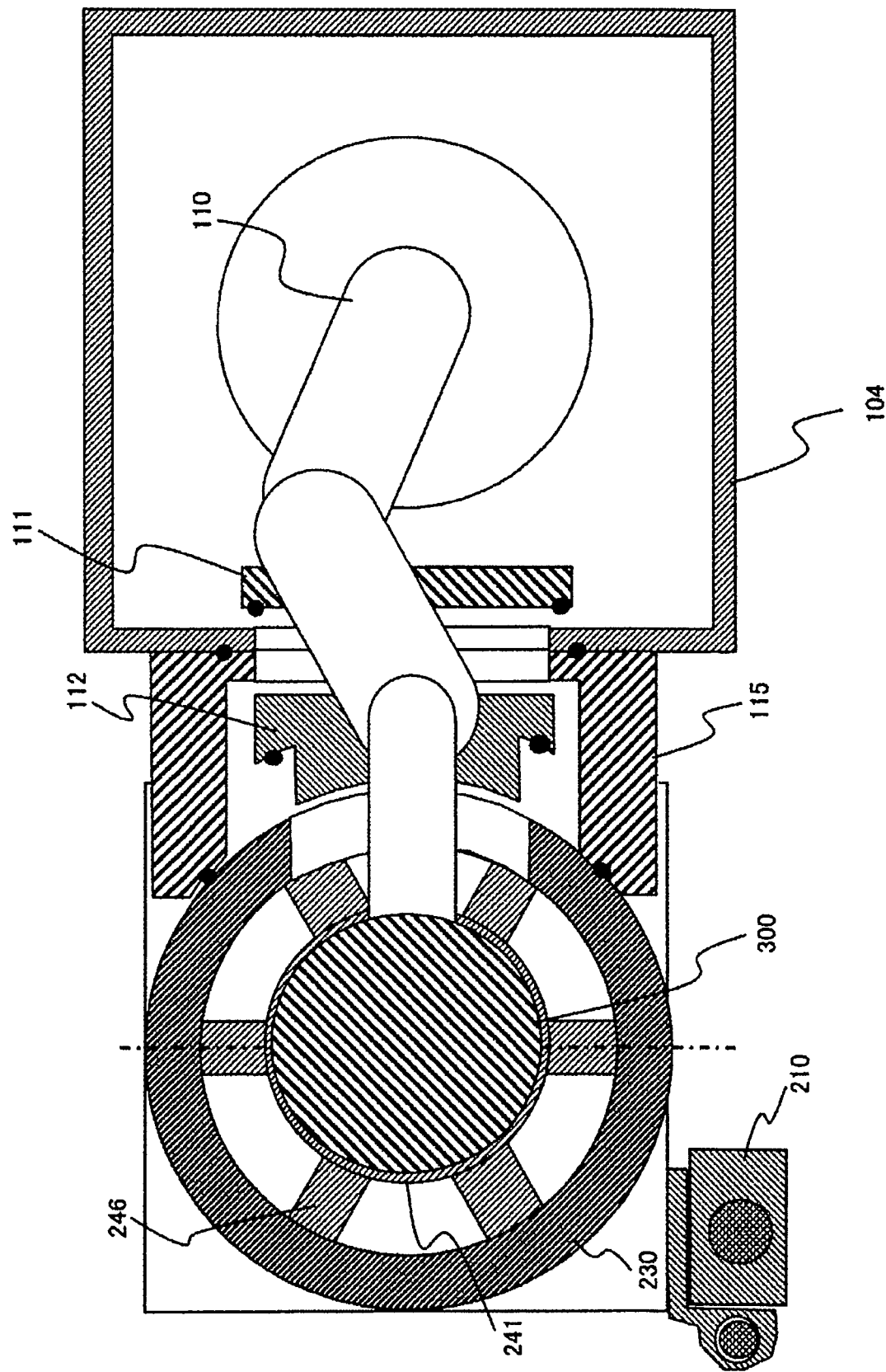
FIG. 3 is a schematic top view of main components for describing transfer of a subject to be processed in the vacuum processing apparatus according to the example of the present invention (in the state where a gate valve is opened and a transfer robot is bringing or is about to bring the subject to be processed into the vacuum processing unit.

A mode of transfer of the wafer 300 between the vacuum processing unit 200 and the vacuum transfer chamber 104 in the example will be described with reference to FIGS. 3 and 4. FIG. 3 is a schematic transverse cross-sectional view illustrating the operation of the vacuum transfer robot 110 bringing a specimen W in and out the vacuum processing unit in the vacuum processing apparatus according to the example illustrated in FIGS. 1A and 1B.

In the example, the vacuum processing unit 200 and the vacuum transfer chamber 104 are coupled together in the horizontal direction in the drawings. The upper container 230 constituting the vacuum processing unit 200, a valve box 115, and the transfer chamber 104 are connected together with seal materials such as O rings therebetween and the interiors of these components decompressed at a predetermined vacuum degree are sealed in an airtight manner against the outside air. The vacuum transfer robot 110 transferring the specimen is arranged inside the vacuum transfer chamber 104. The upper container 230, the valve box 115, and the vacuum transfer chamber 104 have openings of gates in the side surfaces constituting a path through which the wafer 300 is passed and transferred. The wafer 300 is passed through the gates and the openings, placed on the holding portion arranged at the leading end of the arm of the vacuum transfer robot 110, and then transferred between the processing chamber within the upper container 230 and the vacuum transfer chamber 104.

In the example, two gate valves are driven and moved in the vertical direction (the direction perpendicular to the drawing plane) to open or close in an airtight manner the openings of gates of the vacuum transfer chamber 104 and the upper container 230. In the example, a first gate valve 111 is arranged inside the vacuum transfer chamber 104 to close the opening of the gate inside the vacuum transfer chamber 104, and a second gate valve 112 is arranged on the outside of the gate of the upper container 230 to close the opening of the gate. The first gate valve 111 is arranged inside the vacuum transfer chamber 104, and the second gate valve is arranged within the valve box 115 connected to the outer wall surface of the upper container 230 and coupled between the upper container 230 and the vacuum transfer chamber 104.

When the first gate valve 111 and the second gate valve 112 are opened, the vacuum transfer robot 110 extends the arm formed by coupling a plurality of beam-like members on both ends via joints and capable of entirely extending and contracting in a specific direction by rotation of actuators and motors in the joints, in the state where the wafer 300 is placed on the holding portion arranged at the tip of the arm. Accordingly, the wafer 300 is passed through the plurality of gates and transferred from the interior of the vacuum transfer chamber 104 onto the placement surface of the specimen stage 241 within the upper container 230. Otherwise, the wafer 300 having been completely processed is transferred from the top of the specimen stage 241 within the upper container 230 into the vacuum transfer chamber 104 by the contraction of the arm.

Figure 4:
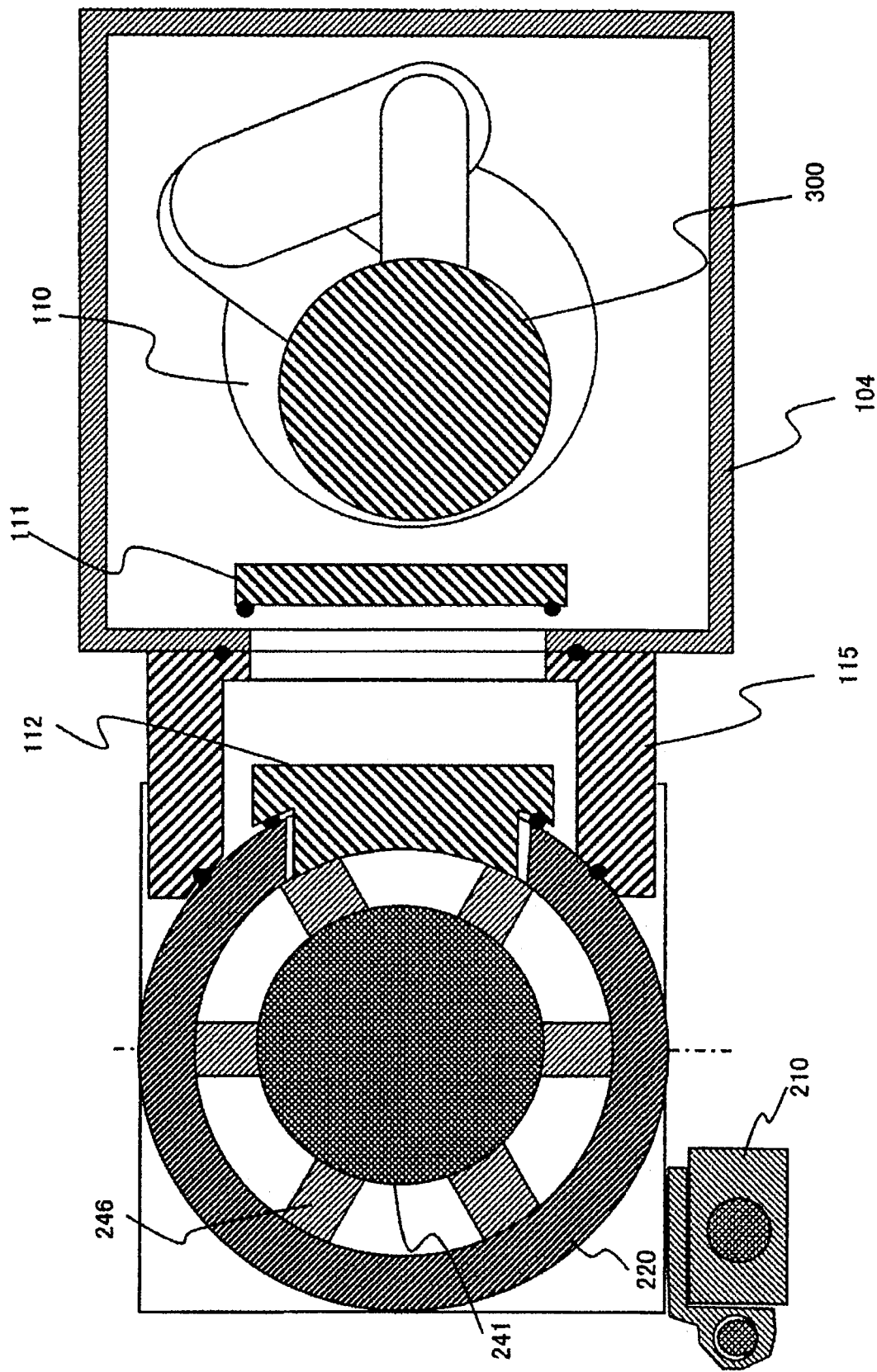
FIG. 4 is a schematic top view of main components for describing transfer of the subject to be processed in the vacuum processing apparatus according to the example of the present invention (in the state where the gate valve is closed and the subject to be processed is brought in a vacuum transfer chamber.

FIG. 4 is a schematic transverse cross-sectional view illustrating the state of the vacuum processing apparatus where the specimen W is being processed inside the vacuum processing unit illustrated in FIGS. 1A and 1B. Referring to FIG. 4, when the specimen W is being processed, the second gate valve 112 closes the opening of the gate of the upper container 230 in an airtight manner and the interior of the processing chamber is sealed against the interior of the valve box 115 and the vacuum transfer chamber 104. In this state, the specimen W is processed by the use of plasma formed in the processing chamber. At this time, the first gate valve 111 may be opened or closed.

When the second gate valve 112 is closed, the valve body of the second gate valve 112 prevents the passage of the gas through the gates such that the outer peripheral side wall of the upper container 230 around the opening of the upper container 230 and the seal means such as the O ring arranged along the outer peripheral edge of the contact surface of the valve body are in contact with each other. In this state, the upper surface of a convex portion of the valve body arranged at the center side of the O ring and surrounded by the O ring is shaped to constitute a wall surface integrated with the cylindrical inner wall surface of the upper container 230.

Specifically, the convex portion of the valve body of the second gate valve 112 in the center on the seal surface side has an arc shape that is concentric with the cylindrical shape of the inner wall of the upper container 230 or the processing chamber and is in equal in curvature to the same in a state where the gate is closed by the second gate valve 112. Accordingly, the shape of the processing chamber formed by the inner wall surface of the upper container 230 and the end surface of the convex portion of the valve body of the second gate valve 112 facing the processing chamber constitutes the side surface of a cylinder concentric with the central axis of the specimen stage 241. Accordingly, the irregularity of the inner wall surface of the processing chamber caused by the valve body of the second gate valve 112 can be reduced. This makes it possible to prevent the situation in which the circumferential distribution of the gas and plasma within the processing chamber becomes deflected and causes unevenness in the processing of the specimen W.

Figure 5A:
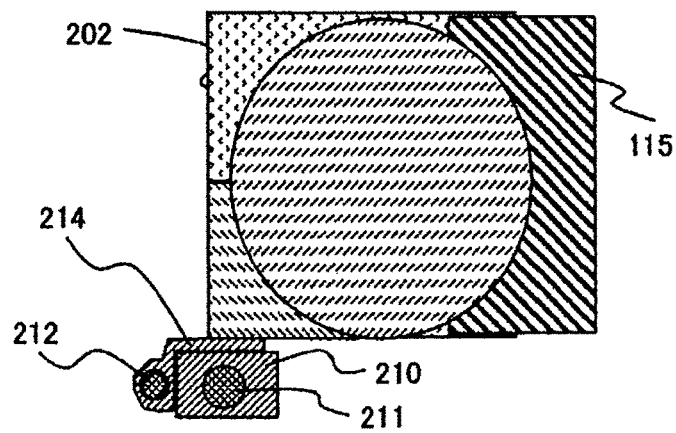
FIGS. 5A and 5B are top views for describing a procedure for maintenance of the vacuum processing unit in the vacuum processing apparatus according to the example of the present invention (in the state where a coil and a power source are removed), which is a schematic cross-sectional view of the vacuum processing unit illustrated in FIG. 4A.
Figure 5B:
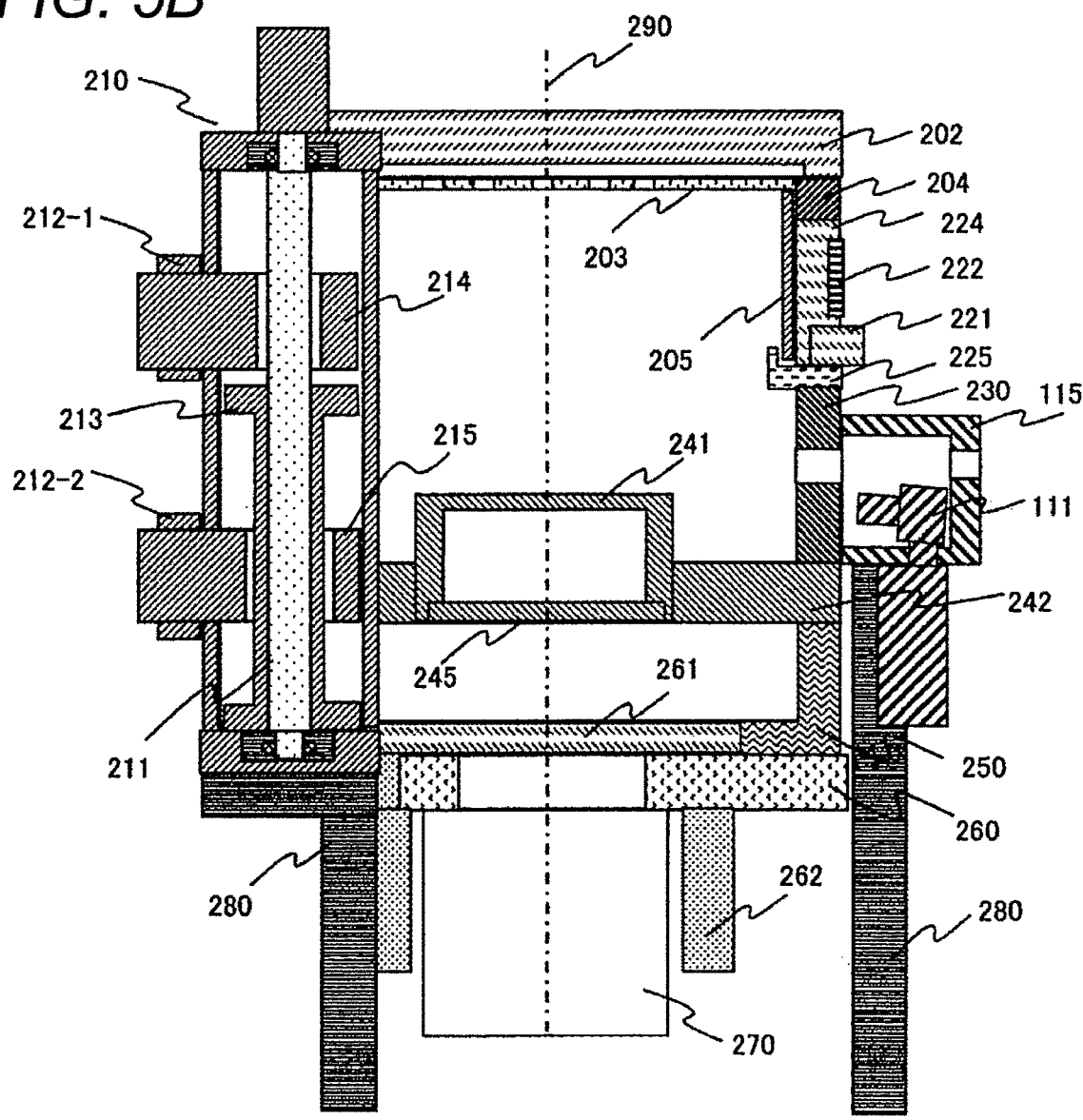

The attachment and detachment of the vacuum container during maintenance of the plasma processing apparatus in the example will be described with reference to FIGS. 5 to 14. FIGS. 5A and 5B are diagrams schematically illustrating the state in which the units of the first high-frequency power source 201 and the solenoid coil 206 are removed upward from the vacuum container at maintenance of the plasma processing apparatus according to the example illustrated in FIG. 2. FIG. 5A is a top view and FIG. 5B is a vertical cross-sectional view.

Figure 6:
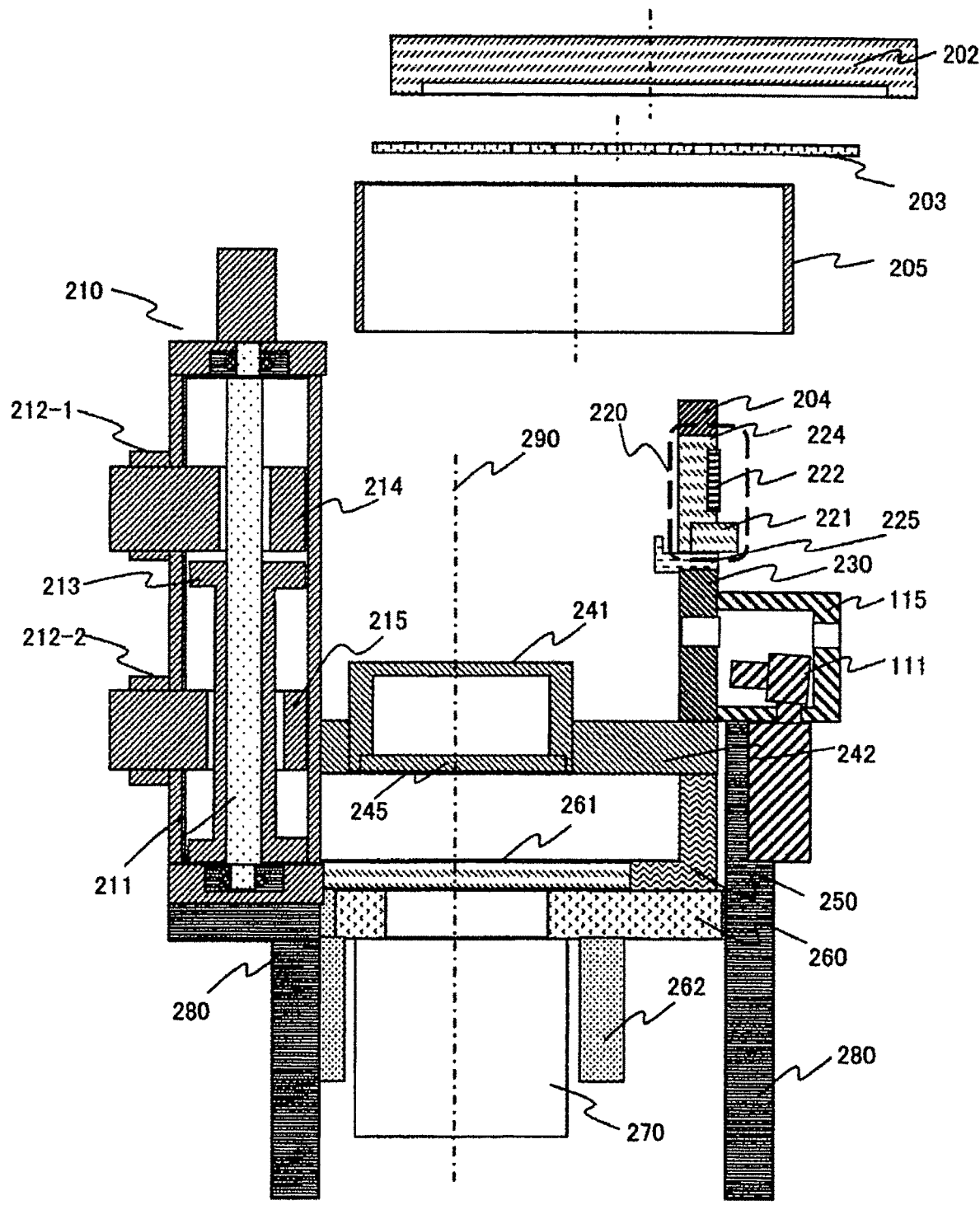
FIG. 6 is a top view for describing the procedure for maintenance of the vacuum processing unit in the vacuum processing apparatus according to the example of the present invention (in the state where a quartz plate, a shower plate, and a quartz inner cylinder are removed), which is a schematic cross-sectional view illustrated in FIG. 5A.
Figure 7:
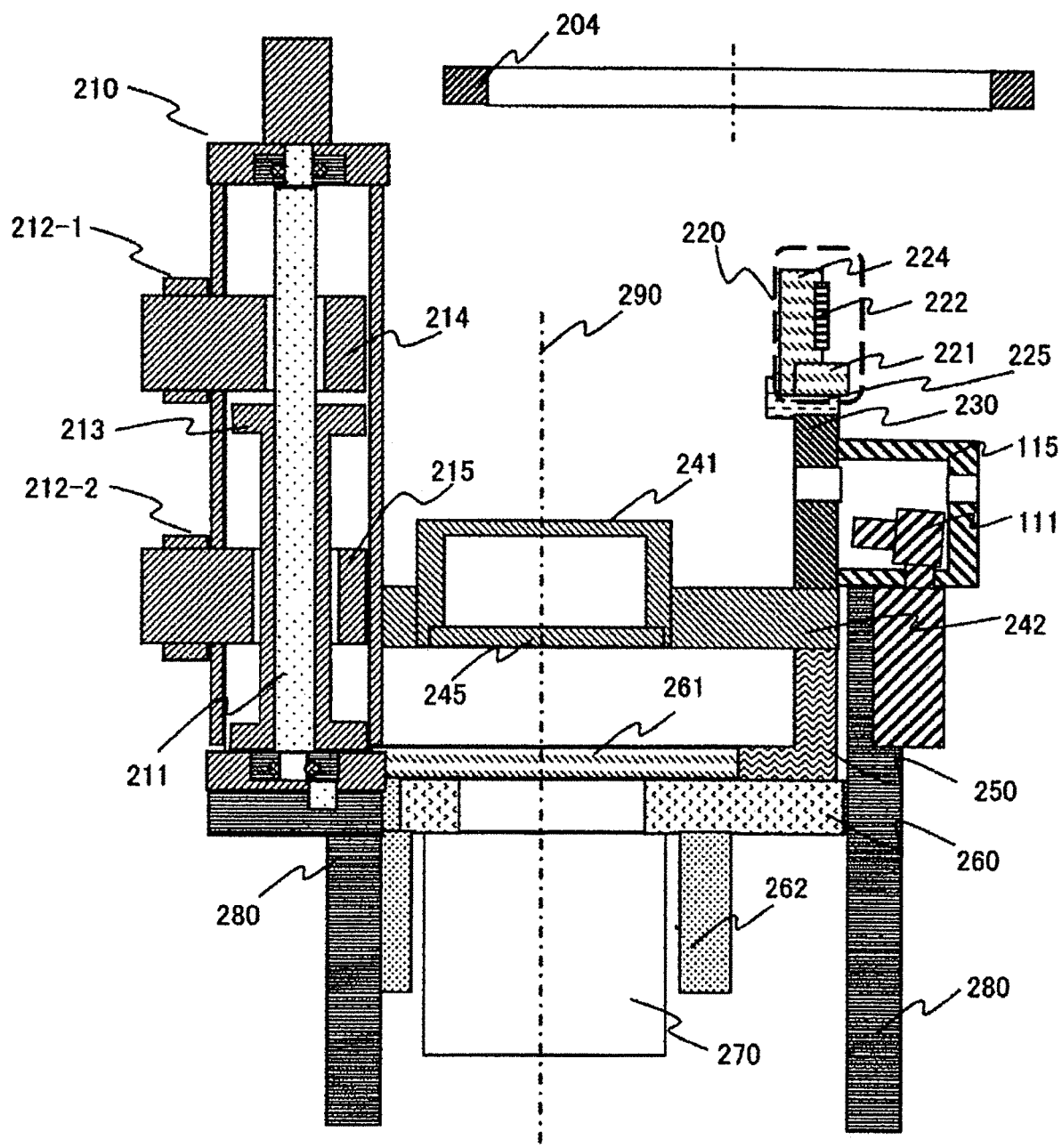
FIG. 7 is a top view for describing the procedure for maintenance of the vacuum processing unit in the vacuum processing apparatus according to the example of the present invention (in the state where a gas introduction ring is removed), which is a schematic cross-sectional view of the vacuum processing unit illustrated in FIG. 6A.

FIGS. 6 and 7 are schematic vertical cross-sectional views of the plasma processing apparatus illustrated in FIGS. 5A and 5B from which the upper members of the vacuum container are further removed. Referring to these drawings, the direction of coupling between a vacuum transfer unit 103 and the vacuum transfer chamber 104 is equal to the direction illustrated in FIGS. 3 and 4.

FIGS. 5A and 5B illustrate the state of the vacuum processing unit 200 in which the solenoid coil 206 and the first high-frequency power source 201 are removed from the vacuum processing unit illustrated in FIG. 2 and the exhaust opening 263 of the base plate 260 connected to the exhaust pump 270 is closed in an airtight manner by the exhaust portion cover 261. In the example, the interior of the processing chamber to be opened to the air after the maintenance work and the inlet of the exhaust pump 270 are divided by the exhaust portion cover 261 in an airtight manner so that the exhaust pump 270 can be operated even during the maintenance work. This reduces the time taken for re-starting and bringing the vacuum processing unit 200 into operational state after the maintenance.

Next, a rare gas of nitrogen or the like is introduced into the processing chamber to increase the inner pressure to be equal to or slightly higher than the air pressure. In this state, as illustrated in FIG. 6, the cover member 202 constituting the upper part of the vacuum container of the vacuum processing unit 200, the shower plate 203 constituting the ceiling surface of the processing chamber under the cover member 202, and the quartz inner cylinder 205 are moved upward over the discharge block 224 and the gas introduction ring 204 and removed from the vacuum container.

In the state in which the quartz inner cylinder 205 is removed, the inner peripheral side wall surface of the gas introduction ring 204 is exposed to the inside air at the upper end of the vacuum processing unit. In addition, the specimen stage 241 and the support beams 246 of the specimen stage base 242 are also exposed to the air. After that, as illustrated in FIG. 7, the gas introduction ring 204 is moved upward from the upper end of the discharge block 224 and removed from the vacuum container body.

A configuration of a turning lifter 210 included in the vacuum processing unit in the example will be described below. The turning lifter 210 is a member having at least one shaft coupled to the outer peripheral end portion of the base plate 260 and extending in the vertical direction. The shaft includes a shaft to which the vacuum container is coupled to move along the shaft in the vertical direction and a shaft to which the vacuum container is coupled to turn around the shaft.

The turning lifter 210 in the example includes a vertical shaft 211 to which two containers constituting the vacuum container are coupled to move in the vertical direction, and a turning shaft 212 to which the two containers constituting the vacuum container are coupled to turn in the horizontal direction. The vertical shaft 211 is a cylindrical or columnar member extending beyond the upper end of the gas introduction ring 204 from the upper surface of the base plate 260. The discharge block unit 220 and the specimen stage unit 240 are coupled to the vertical shaft 211 at different heights in the vertical direction.

The end portions of the discharge block unit 220 and the specimen stage unit 240 are coupled to turning bases 214 and 215 as members having through holes through which the vertical shaft 211 penetrates and being movable at different heights along the vertical shaft 211, so that the discharge block unit 220 and the specimen stage unit 240 are vertically changeable in height with the movement of the turning bases 214 and 215 in the direction of the central axis of the vertical shaft 211. The turning bases 214 and 215 include turning shafts 212-1 and 212-2, respectively, as cylindrical or columnar joint portions in through holes having central axes in parallel to the axes of the through holes through which the vertical shaft 211 penetrates.

The turning base 214 is coupled to the discharge block unit 220 and the turning base 215 is coupled to the specimen base unit via the turning shafts 212-1 and 212-2. The discharge block unit 220 rotates around the central axis of the turning shaft 212-1, and the specimen stage unit 240 rotates around the central axis of the turning shaft 212-2.

As illustrated in FIGS. 5A and 5B, in the example, the turning shafts 212-1 and 212-2 of the turning bases 214 and 215 are arranged on the left side of the vertical shaft 211 of the turning lifter 210 in FIGS. 5A and 5B, that is, on the side of the vacuum container opposite to the discharge block unit 220 and the specimen stage unit 240 or opposite to the valve box 115 or the vacuum transfer chamber 104 not illustrated. By positioning the axes around which these units rotate horizontally on the outward right-left side of the vertical shaft 211 of the turning lifter 210 with respect to the axis of the vacuum processing apparatus 100 in the front-back direction, it is possible to move the discharge block unit 220 and the specimen stage unit 240 to positions more distant from the central axis 290 of the vacuum container of the vacuum processing unit 200 at large turning angles, and provide a larger space for maintenance of these units to facilitate the maintenance work with improvement in efficiency.

In the example, a traveling nut 213 as a cylindrical member is arranged under the turning base 214 of the vertical shaft 211 and penetrates vertically through the turning base 215 thereunder. The vertical shaft 211 penetrates through the traveling nut 213. The traveling nut 213 is vertically movable along the outer peripheral side wall of the cylindrical vertical shaft 211 in the direction of the central axis of the vertical shaft 211.

The traveling nut 213 has at the upper and lower ends ring-shaped flange portions extending to the outer peripheral side. When the traveling nut 213 moves upward in excess of a predetermined value, the upper end of the traveling nut 213 including the flange portion contacts the lower surface of the turning base 214. By further moving the traveling nut 213 upward, the turning base 214 and the discharge block unit 220 coupled to the turning base 214 can be moved upward.

When the traveling nut 213 further moves upward, the upper surface of the flange portion of the traveling nut 213 at the lower end comes into contact with the lower surface of the turning base 215. In this state, by further moving the traveling nut 213 upward, the pair of the turning base 214 and the discharge block unit 220 and the pair of the turning base 215 and the specimen stage unit 240 can be both moved upward.

Referring to FIGS. 5 and 7, the traveling nut 213 is positioned at the lower limit of the movable range of the vertical shaft 211 in the axial direction. In the example, in this state, the gap between the lower surface of the turning base 214 and the upper surface of the upper end of the traveling nut 213 to be in contact with the lower surface of the turning base 214 is set to 1 to 5 mm. In addition, in the example, the gap between the lower surface of the turning base 215 and the upper surface of the flange of the traveling nut 213 at the lower end to be in contact with the lower surface of the turning base 215 is set such that the two components in contact with each other constitute the discharge block unit 220 that is coupled to the turning base 214 placed on the upper end of the traveling nut 213, and the lower end of the discharge block 224 or the lower end of the ring-shaped discharge block base 221 is higher than the upper end of the protrusion of the earth ring 225 positioned downward. The gap is set to 5 cm in the example, but is not limited to this.

Figure 8:
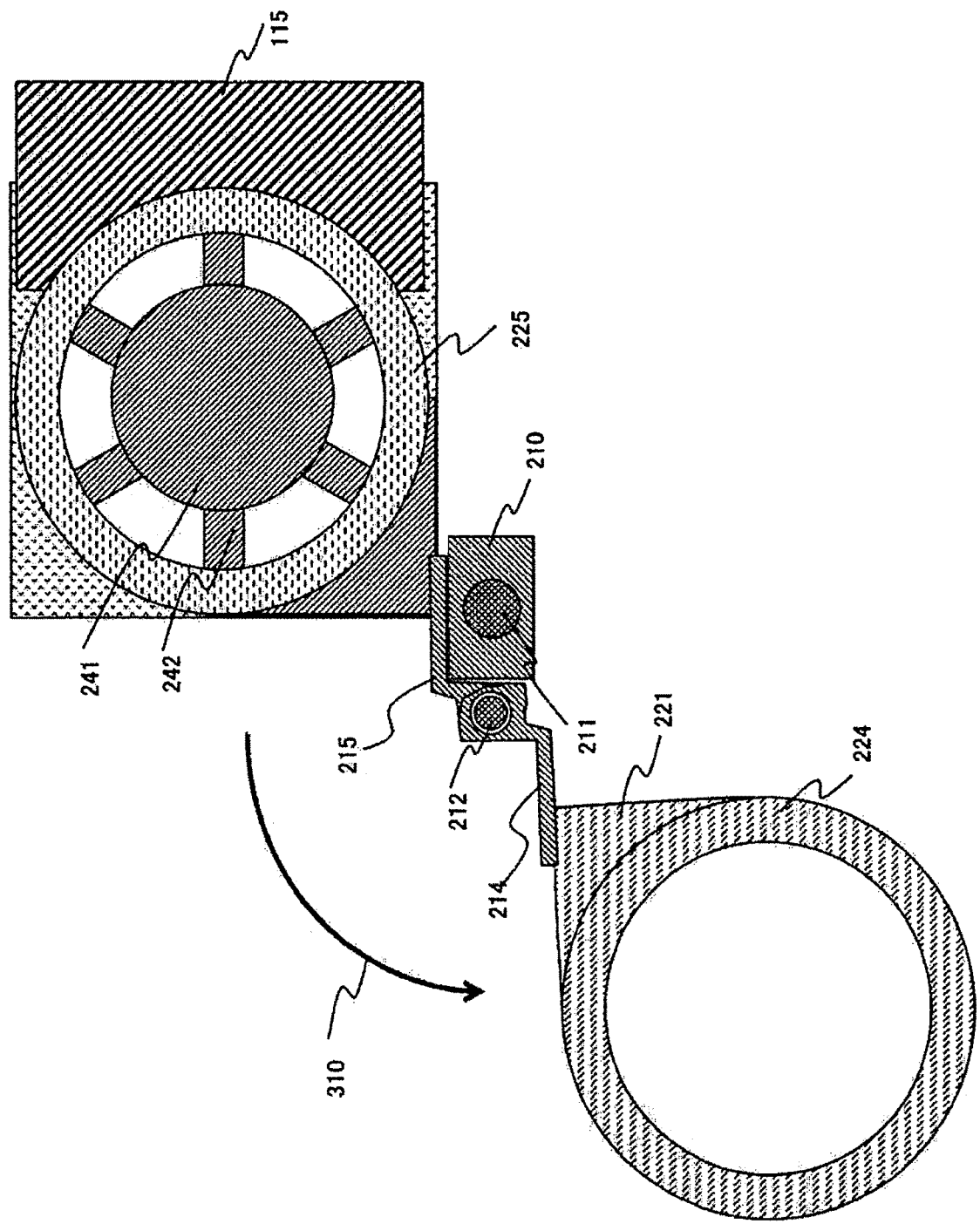
FIG. 8 is a top view for describing the procedure for maintenance of the vacuum processing unit in the vacuum processing apparatus according to the example of the present invention (in the state where a discharge block unit is lifted and turned by a turning lifter)
Figure 9:
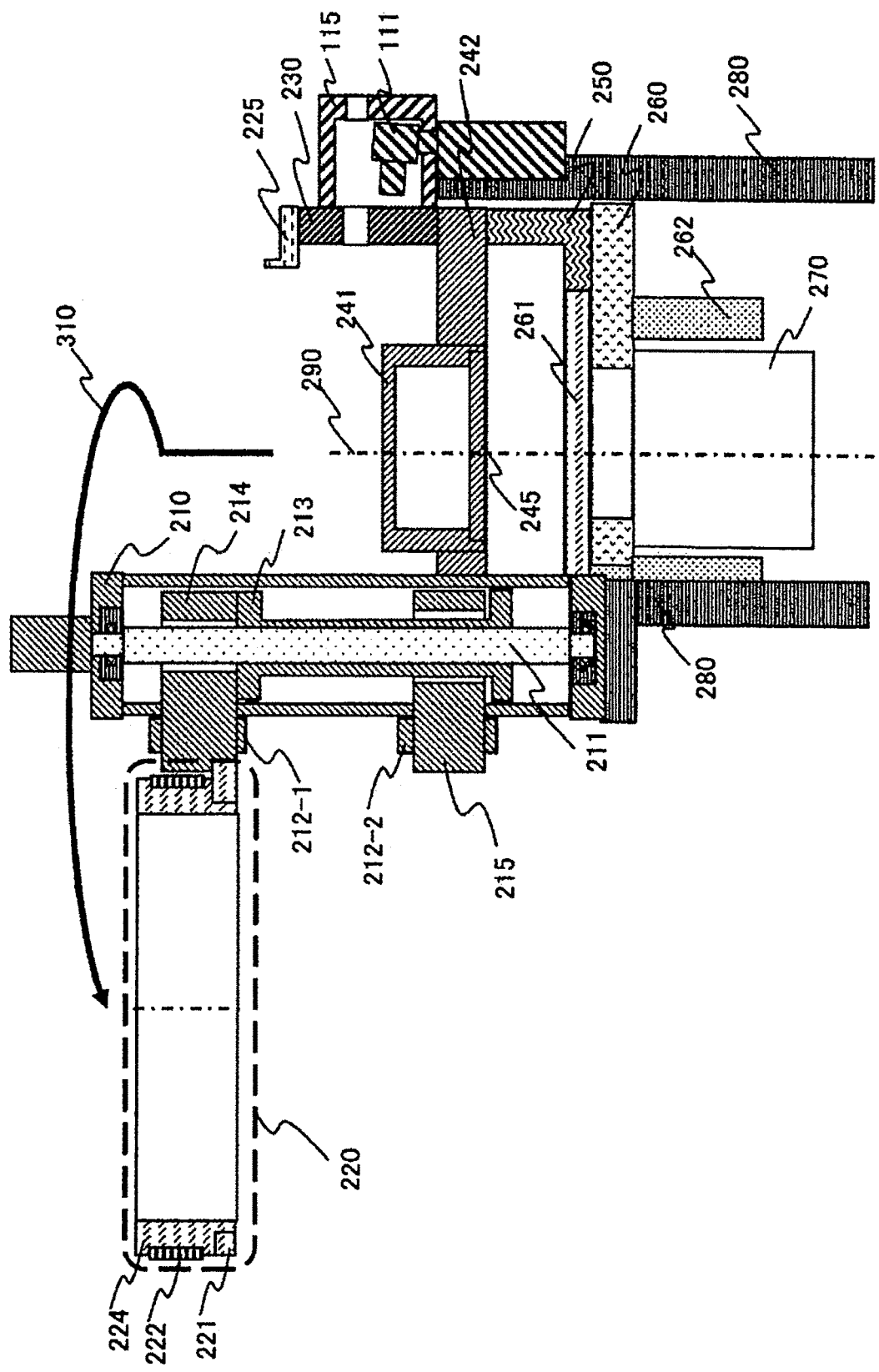
FIG. 9 is a schematic cross-sectional view of the vacuum processing unit illustrated in FIG. 7A.

Next, as illustrated in FIGS. 8 and 9, the discharge block unit 220 is rotated around the turning shaft 212-1, moved in the horizontal direction (the leftward direction in the drawings), and removed from the top of the upper container 230 constituting the vacuum container positioned downward. FIG. 8 illustrates schematically a configuration of the plasma processing apparatus from which the discharge block unit 220 is further removed from the plasma processing apparatus illustrated in FIG. 7. FIG. 8 is a schematic top view of the plasma processing apparatus in which the discharge block unit 220 is turned. FIG. 9 is a schematic vertical cross-sectional view of the plasma processing apparatus in which the discharge block unit 220 is turned.

As illustrated in these drawings, in the example, in order to remove the containers constituting the vacuum container opened to the air or allow the worker to approach the containers for maintenance or inspection of the vacuum container, the discharge block unit 220 including the discharge block base 221 coupled and connected to the turning base 214 and the discharge block 224 and the heater 222 connected and attached to the discharge block base 221 is first moved upward along the central axis of the vertical shaft 211 as indicated by arrow 310 in FIG. 9, and then is turned horizontally counterclockwise around the turning shaft 212. Accordingly, the discharge block unit 220 is moved from the top of the specimen stage 241 or the central axis 290 of the vacuum container in the perpendicular direction to the side opposite to the specimen stage 241 or the vacuum processing unit 200 across the turning lifter 210 or the turning shaft 212-1.

The discharge block unit 220 can be moved upward in the direction of the central axis of the vertical shaft 211 by moving upward the traveling nut 213 along the cylindrical side wall of the traveling nut 213, bringing the upper surface of the flange portion of the traveling nut 213 at the upper end into contact with the lower surface of the turning base 214, and moving the turning base 214 upward by a predetermined distance and lifting off the same. At this time, since there is the gap of 1 to 5 mm between the traveling nut 213 and the turning base 215 as described above, the specimen stage unit 240 remains on the lower container 250.

In the example, the turning lifter 210 is arranged at a position where the discharge block unit 220 can be turned counterclockwise at the end portion of the base plate 260 opposite to the valve box 115 or the vacuum transfer chamber 104 across the vacuum container (in FIG. 8, the lower left side of the specimen stage 241 or the earth ring 225) so that the discharge block unit 220 can be moved and removed from the top of the vacuum container. However, the position of the turning lifter 210 is not limited to this. Alternatively, the turning lifter 210 may be arranged at the end portion of the base plate 260 at the upper left side of the specimen stage 241 or the earth ring 225 in FIG. 8 so that the discharge block unit 220 can be turned clockwise and removed.

In the example, at the first stage of the removal of the discharge block unit 220, the distance at which the discharge block unit 220 is moved upward in the direction of the central axis 290 is set such that the lower end of the earth ring 225 comes beyond the upper end of the protrusion of the earth ring 225. The distance is set to 5 cm in the example, but is not limited to this.

In the example, the angle at which the discharge block unit 220 is turned is 180 degrees, although it may be selected within the range of 90 to 270 degrees depending on the specifications required by the worker or the user. The inventors have determined the preferable angle as 180±20 degrees taking the efficiency of maintenance work into account.

In the foregoing example, the discharge block 224, the discharge block base 221, the heater 222, and the like are turned as the one discharge block unit 220 in which these components are connected together. This is because a relatively small amount of reaction product sticks to the discharge block unit 220 and the discharge block unit 220 is not a target of maintenance and inspection including replacement of parts of other vacuum containers. Coupling the turning lifter 210 and the discharge block unit 220 allows these components to be moved quickly and easily from the upper part of the vacuum processing unit 200, thereby reducing the amount of of maintenance and inspection work and saving time.

When the discharge block unit 220 is removed from the top of the vacuum container according to the process illustrated in FIGS. 8 and 9, the earth ring 225 is exposed on the upper end of the vacuum container of the vacuum processing unit 200.

Figure 10:
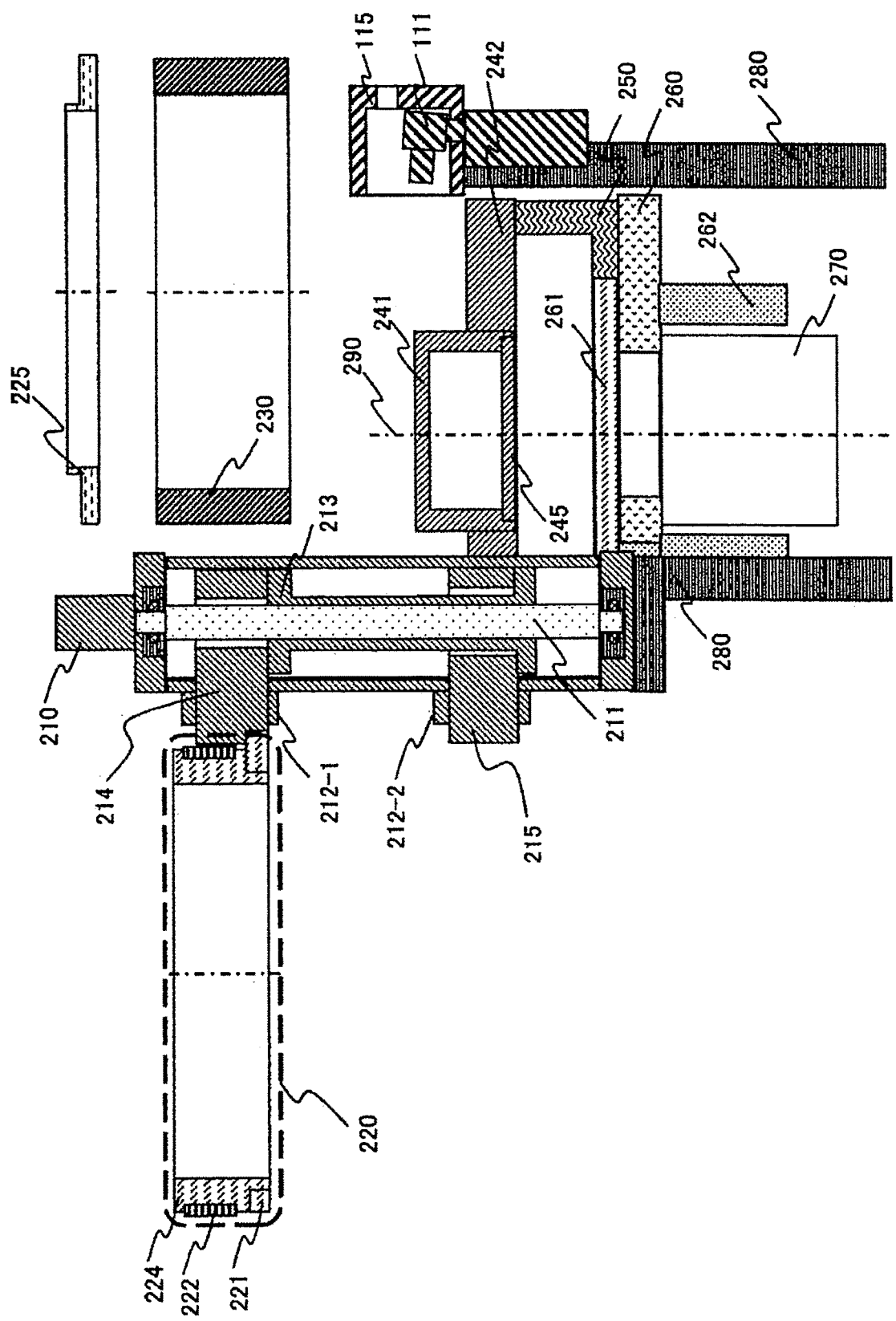
FIG. 10 is a top view for describing the procedure for maintenance of the vacuum processing unit in the vacuum processing apparatus according to the example of the present invention (in the state where an earth ring and an upper container are removed), which is a schematic cross-sectional view of the vacuum processing unit illustrated in FIG. 8A.

Next, as illustrated in FIG. 10, the earth ring 225 and the upper container 230 are moved upward relative to the member under the vacuum container or the base plate 260, and are removed from the vacuum processing unit 200. FIG. 10 is a schematic vertical cross-sectional view of a configuration of the plasma processing apparatus from which the earth ring 225 and the upper container 230 are further removed from the plasma processing apparatus illustrated in FIG. 9.

In the example, when the control device determines that the total number of the processed wafers 300 or the total amount of time of processing with plasma has exceeded a predetermined value, the start of processing the next wafer 300 is temporally suspended. The vacuum processing unit 200 starts operations for maintenance and inspection. At the maintenance and inspection, the upper container 230 having the inner surface constituting the inner wall surface of the processing chamber with a relatively large amount of reaction product formed during the processing is not cleaned such that the deposited matter is wiped off the surface of the upper container 230 installed in the vacuum processing unit 200 with cloth or the like, but is swapped (replaced) by a new or clean upper container 230 with the inner wall surface cleaned, which is identical in configuration to the former upper container 23.

The upper container 230 is removed by the worker removing screws such as bolts intended for fastening and fixing the upper container 230 through the flange portion on the outer peripheral side wall and lifting the upper container 230 upward. When the upper container 230 is fastened to the base plate 260, an O ring 207 is sandwiched under a vertically applied load between the lower surface of the lower end of the upper container 230 and the upper surface of the upper end of the ring-shaped portion on the outer peripheral side of the specimen stage base 242 opposed to the lower surface of the upper container 230. Accordingly, the worker needs to strip off the O ring 207 deformed and sticking to either the upper or lower surface at the time of removal of the upper container 230. The discharge block unit 220 positioned above is turned around the turning shaft 212 of the turning base 214 and positioned in a working space between the base plate 260 or the vacuum container positioned above and the adjacent vacuum processing apparatus on the opposite side across the turning lifter 210, thereby to provide a sufficient space for the worker to perform work. Accordingly, it is possible to suppress the increase in work amount and time for removal of the upper container 230 to be cleaned or installation of another upper container 230 with improvement in work efficiency.

In the example, the discharge block unit 220 is moved by adjusting the operation of the turning lifter 210 under instructions from the control device. The control device may be dedicated for adjustment of operation of the turning lifter 210 or may be part of the function of adjusting the entire operation of the vacuum processing unit 200 or the vacuum processing apparatus 100. As described above, when the upper container 230 illustrated in FIG. 10 is removed, the specimen stage base 242 including the specimen stage 241, the support beams 246, and the ring-shaped portion on the outer peripheral side are exposed to the outside.

Figure 11:
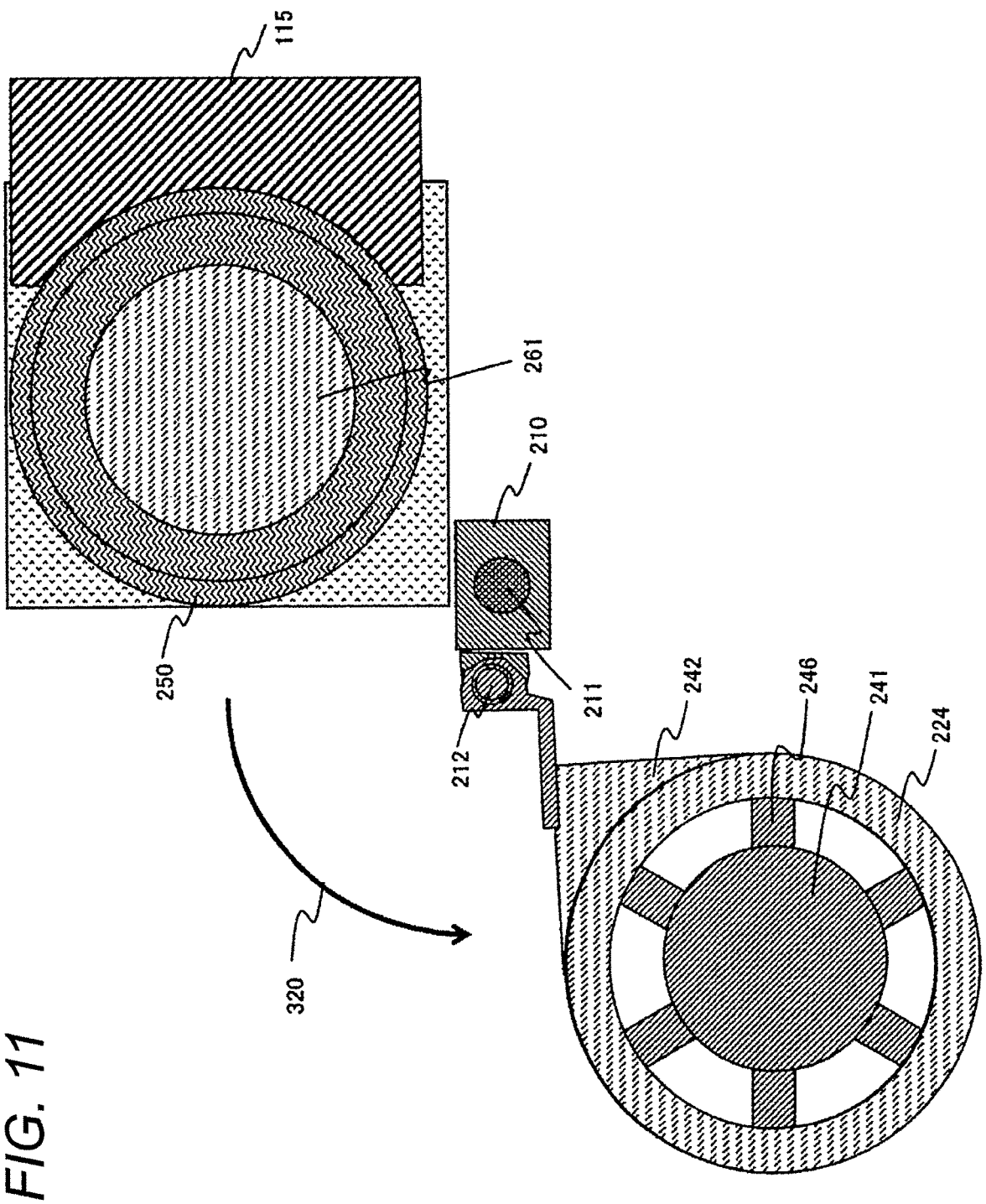
FIG. 11 is a top view for describing the procedure for maintenance of the vacuum processing unit in the vacuum processing apparatus according to the example of the present invention (in the state where a specimen stage unit is lifted and turned by the turning lifter)
Figure 12:
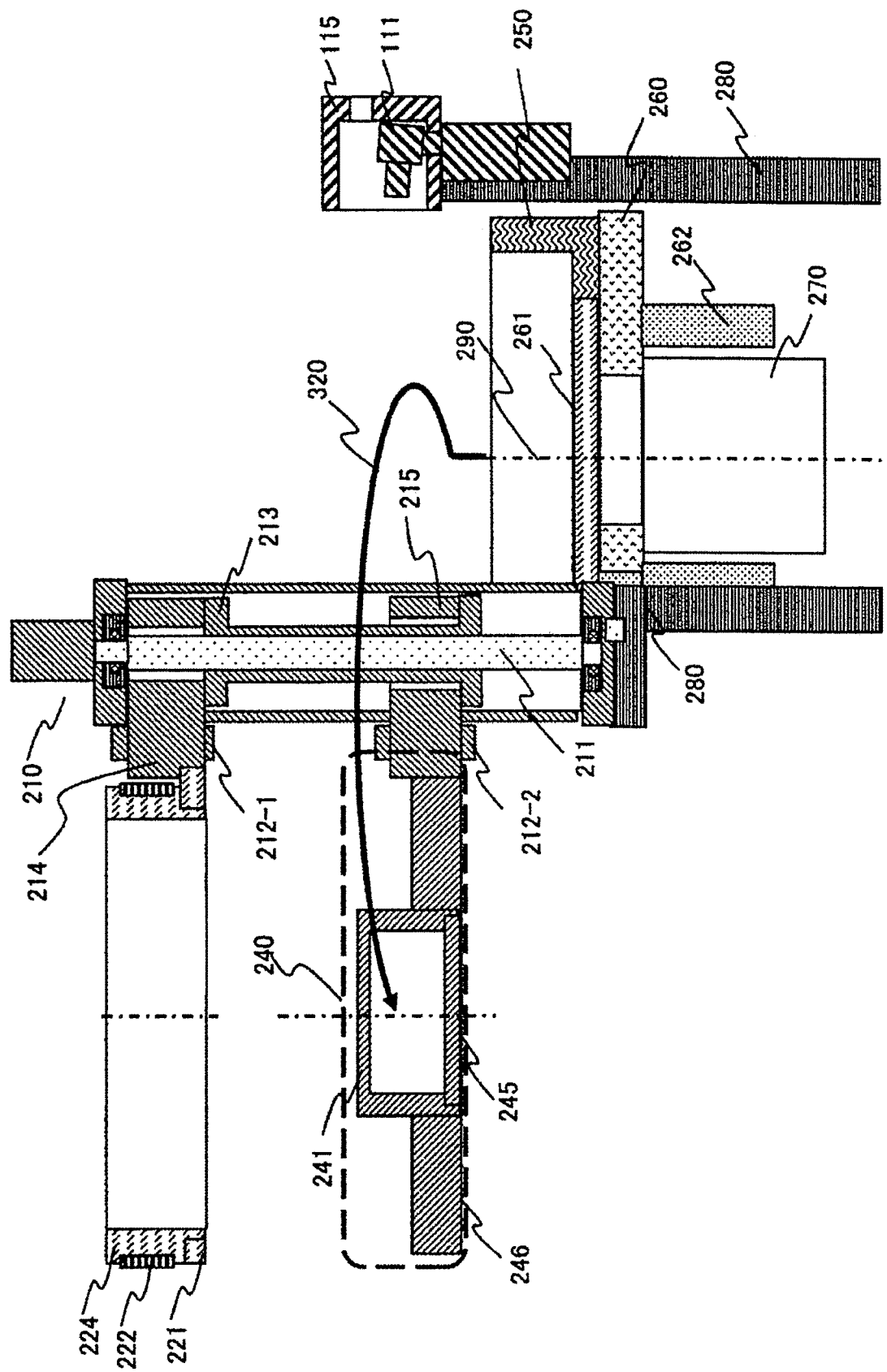
FIG. 12 is a schematic cross-sectional view of the vacuum processing unit illustrated in FIG. 9A.

Next, as illustrated in FIGS. 11 and 12, the specimen stage unit 240 including the specimen stage base 242 coupled and connected to the turning base 215 of the turning lifter 210 and the specimen stage 241 and the specimen stage bottom cover 245 coupled to the specimen stage base 242 is turned horizontally counterclockwise around the turning shaft 212-2 as indicated by arrow 320, and the specimen stage unit 240 is removed from the vacuum container or the vacuum processing unit 200. FIGS. 11 and 12 illustrate schematically a configuration of the plasma processing apparatus from which the specimen stage unit 240 is further removed from the plasma processing apparatus illustrated in FIG. 10. FIG. 11 is a schematic top view of the plasma processing apparatus in which the specimen stage unit 240 is turned, and FIG. 12 is a schematic vertical cross-sectional view of the plasma processing apparatus in which the specimen stage unit 240 is turned.

In the vacuum processing unit 200 of the example, the specimen stage unit 240 is first moved upward by a predetermined distance along the central axis 290 as indicated by arrow 320 in FIG. 12, then rotated counterclockwise around the turning shaft 212-2 as illustrated in FIG. 11 and removed from the top of the lower container 250 left under, and then moved to the area on the outside of the base plate 260. At this time, the turning base 215 coupled and connected to the specimen stage unit 240 is brought into the upper surface of the flange portion of the lower end of the traveling nut 213 moving upward along the outer peripheral side wall of the vertical shaft 211 of the turning lifter 210, and is moved upward together with the traveling nut 213 by a predetermined distance and then stopped.

The specimen stage unit 240 is turned counterclockwise in the example, but the configuration of the specimen stage unit 240 is not limited to this. Alternatively, the specimen stage unit 240 may be turned clockwise by changing the position of the turning lifter at the outer peripheral edge of the base plate 260. The distance over which the specimen stage unit 240 is moved upward is larger than the height at which the O ring 207 sandwiched between the specimen stage unit 240 and the lower container 250 arranged under for placement of the specimen stage unit 240 can be stripped off the specimen stage unit 240 or the lower container 250. The height is set to 1 cm in the example but is not limited to this.

The angle at which the specimen stage unit 240 is turned is desirably set to be equal to the angle of the discharge block unit 220. Accordingly, the total footprint of the discharge block unit 220 and the specimen stage unit 240 as seen from above can be reduced during maintenance work. As a result, it is possible to suppress expansion of the working space between the adjacent vacuum processing apparatuses, and increase the number of the vacuum containers installable on a floor surface in a building where a plurality of vacuum processing apparatuses is to be installed, thereby achieving enhancement in the efficiency of manufacturing.

By turning and moving the one specimen stage unit 240 in which the components including the specimen stage 241 are integrated, it is possible to allow the removal of the components constituting the vacuum container such as the specimen stage 241 from the vacuum processing unit 200 in a short time. During the processing, the wafer 300 is placed on the placement surface on the top of the specimen stage 241 and reaction products are unlikely to stick to the specimen stage unit 240, and therefore the specimen stage unit 240 is not subjected to regular maintenance and inspection including the replacement of the upper container 230 and the lower container 250. Accordingly, by removing the specimen stage unit 240 as an integral unit including the specimen stage 241 from the top of the lower container 250 and moving the same, it is possible to suppress increase in work amount and time for maintenance and inspection of the lower container 250.

The specimen stage unit 240 is also moved by the control device controlling the turning lifter 210. When the specimen stage unit 240 is rotated around the turning shaft 212-2 and moved into the area on the outside of the base plate 260, the lower container 250 is exposed to the outside at the upper end of the vacuum container left in the vacuum processing unit 200. In addition, the entire upper circular surface of the exhaust portion cover 261 is also exposed to the outside.

Figure 13:
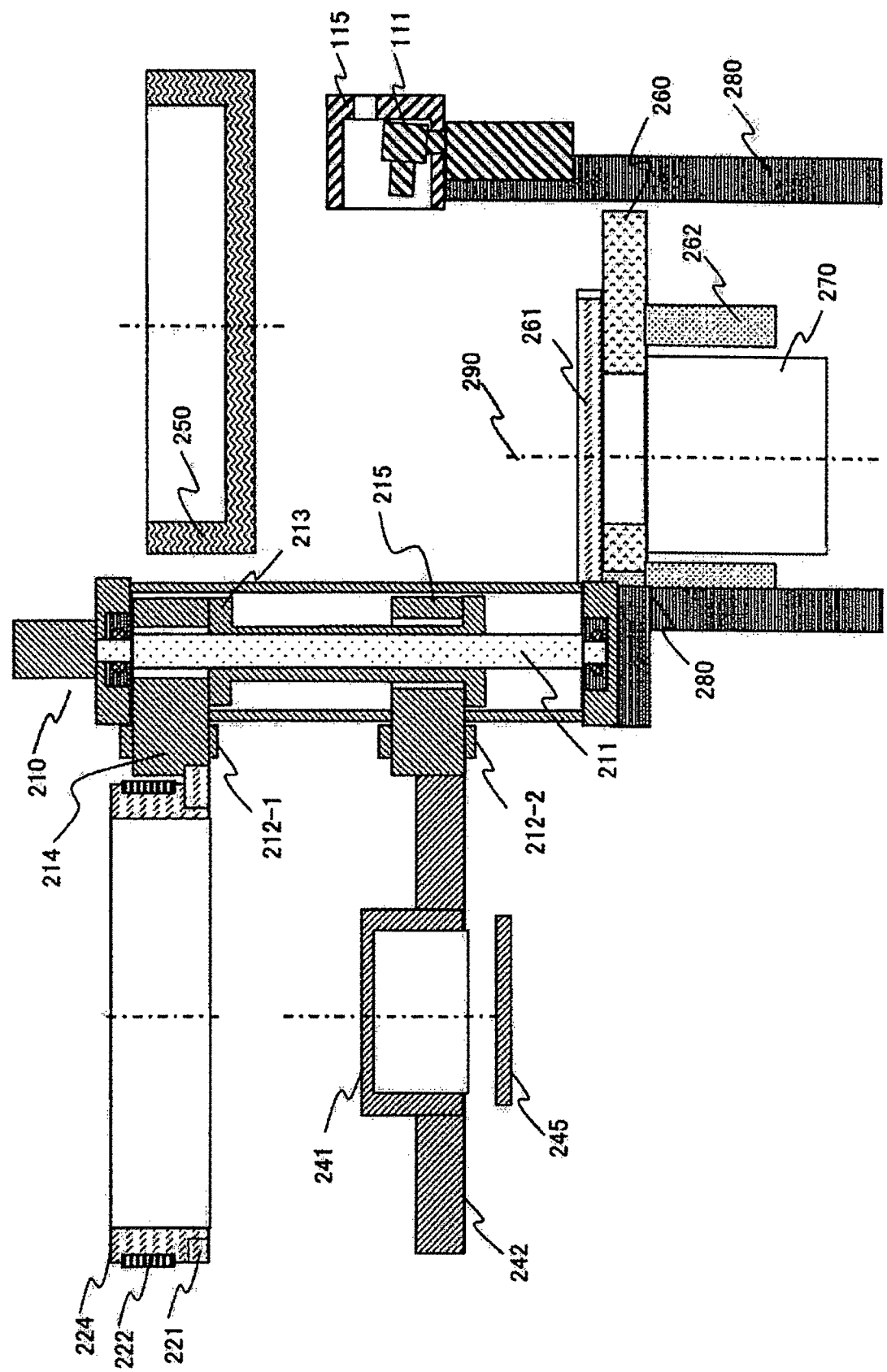
FIG. 13 is a top view for describing the procedure for maintenance of the vacuum processing unit in the vacuum processing apparatus according to the example of the present invention (in the state where a lower container is removed)

Next, the screws fastening the lower container 250 and the base plate 260 at the flange portion are removed, and the lower container 250 is moved upward and detached as illustrated in FIG. 13. When the lower container 250 is installed in the vacuum processing unit 200, the O ring 207 deformed under an upward load is sandwiched between the lower surface of the lower container 250 and the upper surface of the base plate 260 in contact with the lower surface of the lower container 250.

Figure 14:
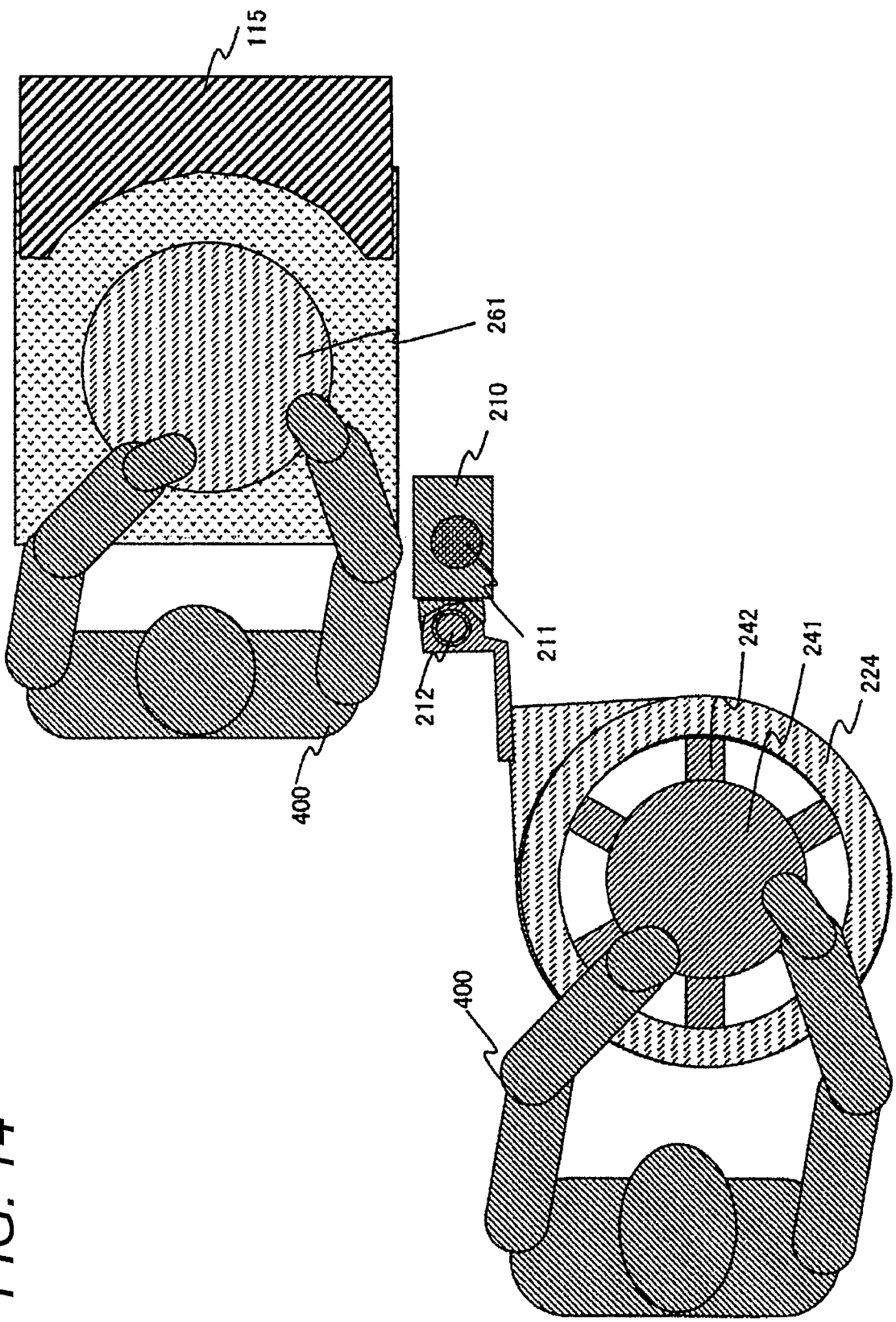
FIG. 14 is a schematic cross-sectional view of the vacuum processing unit illustrated in FIG. 10A.

To remove the lower container 250, it is necessary to lift the lower container 250 by applying a force enough to strip off the O ring 207 deformed and sticking to the lower container 250. In the example, as illustrated in FIG. 14, the specimen stage unit 240 and the discharge block unit 220 as members constituting the vacuum container arranged above the lower container 250 are turned around the turning lifter 210 and moved to the area on the outside of the base plate 260 rectangular in a plane view to form a work space around the base plate 260 without the turning lifter 210 where the worker can work in a standing position. Accordingly, the worker can apply easily an external force necessary for lifting the lower container 250 and remove the lower container 250, and swap (replace) the lower container 250 by a new or cleaned lower container 250. According to this configuration, it is possible to reduce the amount and time of maintenance work of the lower container 250 and suppress increase in non-operating time when the vacuum processing unit 200 is not processing the wafer 300.

When the lower container 250 is removed, the upper surface of the base plate 260 or the upper surface of the exhaust portion cover 261 is exposed to the atmosphere. Accordingly, these components can be subjected to maintenance and inspection as illustrated in FIG. 14. The exposed portion of the base plate 260 has been covered with the lower container 250 so far, and therefore a relatively amount of reaction product is deposited on the exposed portion of the base plate 260. In addition, the upper surface of the circular exhaust portion cover 261 is arranged at a position concentric with the specimen stage 241 or an equivalent position, and the diameter of the exhaust portion cover 261 does not exceed the diameter of the cylindrical specimen stage 241. Accordingly, a relatively small amount of reaction product formed during the processing of the wafer 300 sticks to the upper surface of the exhaust portion cover 261, and can be cleaned off as necessary. As described above, after members constituting the vacuum container as targets of maintenance and inspection are removed from the vacuum processing unit 200 and subjected to cleaning or replacement, the members are installed on the base plate 260 of the vacuum processing unit 200 in the reverse of the removal process to assemble the vacuum container.

In the example, at the removal of the cover member 202, the shower plate 203, the gas introduction ring 204, the quartz inner cylinder 205, the discharge block unit 220, the earth ring 225, the upper container 230, the specimen stage unit 240, and the lower container 250 constituting the vacuum container from the vacuum processing unit 200, the traveling nut 213 is stopped at three heights relative to the cylindrical vertical shaft 211 with the outer peripheral side wall along which the traveling nut 213 moves. Specifically, the three positions are: (1) lower limit position (in the period of removal of the cover member 202, the shower plate 203, the gas introduction ring 204, and the quartz inner cylinder 205, see FIGS. 5 to 7); (2) intermediate position (in the period of removal of the discharge block unit 220, the earth ring 225, and the upper container 230, see FIGS. 8 to 10); and (3) upper end position (in the period of removal of the specimen stage unit 240 and the lower container 250, see FIGS. 11 to 14). In this example, the three positions of the traveling nut 213 are set such that the worker can recognize them by a position sensor or a scale in cooperation with an indicator light not illustrated.

In the example, not only the upper container 230 but also the lower container 250 are replaced. Alternatively, a liner (cover) is attached to cover the inner surface of the lower container 250 such that the liner can be replaced. In addition, in the example, the components other than the discharge block unit 220 and the specimen stage unit 240 to be moved by the turning lifter 210 are manually moved by the worker. Alternatively, these components may be moved by a lifting machine such as a crane.

In the example, the vacuum processing apparatus is an ECR-type vacuum processing apparatus. However, the vacuum processing apparatus is not limited to this but may be an ICP-type vacuum processing apparatus. In addition, the vacuum processing apparatus includes vacuum processing units arranged in a link system. However, the vacuum processing apparatus is not limited to this but may be a cluster-system vacuum processing apparatus.

As described above, according to the example, it is possible to provide a vacuum processing apparatus that can process uniformly even a large-diameter subject in a favorable manner (concentric axisymmetric air exhaust) and allows both regular and irregular maintenance in an efficient manner.

The present invention is not limited to the example described above but includes various modifications. For example, the foregoing example is merely intended to describe the present invention in detail in an easy-to-understand manner but does not necessarily include all of the components described above. In addition, some of the components may be replaced by other components, and other components may be added to some of the components.

What is claimed is:

1. A plasma processing apparatus comprising:
   a vacuum container having a processing chamber in which a wafer arranged in a decompressed interior is processed by use of plasma; and
   a base plate on which the vacuum container is placed, the base plate having an opening through which a gas is exhausted from the processing chamber inside the vacuum container;
   a plurality of members that are vertically stacked to constitute the vacuum container, and the plurality of members constituting the vacuum container are configured to be removable and detachable relative to the base plate;
   a valve box that is arranged between the vacuum container and a vacuum transfer chamber in which the wafer is transferred in a decompressed interior, the valve box being connected in an airtight manner with an outer side wall surface of one member of the plurality of members;
   a lifter that is arranged at a position outside of the vacuum container and opposite to the valve box with the vacuum container arranged therebetween, the lifter including a vertical shaft to which two members of the plurality of members are each coupled at two respective positions vertically distanced so as to vertically move each of the two members along the vertical shaft;
   two coupling members which respectively couple the two members to the vertical shaft, the two coupling members including two turning shafts, each of the turning shafts respectively including a vertical rotational axis that is arranged at a joint position between the respective coupling member and a respective one of the two members, and each of the two members are respectively configured to horizontally turn around the vertical rotational axis of the respective turning shaft between a position directly above the base plate and a position distanced from the valve box, and
   a traveling nut disposed around the vertical shaft and including two flange surfaces which are disposed at upper and lower ends of the traveling nut and vertically distanced more than a distance between the two members when the plurality of members are vertically stacked to constitute the vacuum container, the traveling nut configured to move along the vertical shaft to sequentially contact, one by one, the two coupling members with the two flange surfaces to move, one by one, the two members constituting the vacuum container which are coupled to the two coupling members.

2. The plasma processing apparatus according to claim 1, wherein
   a plurality of seal members are attached between the plurality of members constituting the vacuum container, and
   when the plurality of members are vertically stacked to constitute the vacuum container, a vertical load is applied to the seal members to seal the inside and outside of the vacuum container in an airtight manner.

3. The plasma processing apparatus according to claim 1, wherein
   the traveling nut is configured to vertically move the two members at the same time.

4. The plasma processing apparatus according to claim 1, wherein
   at least one of the turning shafts is arranged on the opposite side of the vacuum transfer chamber with the vertical shaft of the lifter therebetween.

5. The plasma processing apparatus according to claim 1, wherein
   the two members are configured to move along the vertical shaft of the lifter, and thereafter respectively rotate around the two turning shafts.

6. The plasma processing apparatus according to claim 1, wherein
   one of the two members is a specimen stage unit including a specimen stage configured to hold the wafer on an upper surface thereof.

* * * * *